United States Patent
Kang et al.

(10) Patent No.: US 7,508,048 B2
(45) Date of Patent: Mar. 24, 2009

(54) METHODS OF FABRICATING A SEMICONDUCTOR DEVICE HAVING MULTI-GATE INSULATION LAYERS AND SEMICONDUCTOR DEVICES FABRICATED THEREBY

(75) Inventors: Dae-Woong Kang, Seoul (KR);
Hong-Soo Kim, Gyeonggi-do (KR);
Jung-Dal Choi, Gyeonggi-do (KR);
Kyu-Charn Park, Gyeonggi-do (KR);
Seong-Soon Cho, Gyeonggi-Do (KR);
Yong-Sik Yim, Gyeonggi-do (KR);
Sung-Nam Chang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/758,802

(22) Filed: Jan. 15, 2004

(65) Prior Publication Data
US 2004/0145020 A1   Jul. 29, 2004

(30) Foreign Application Priority Data
Jan. 16, 2003  (KR) ............... 10-2003-0003093
Aug. 1, 2003   (KR) ............... 10-2003-0053551

(51) Int. Cl.
*H01L 29/00* (2006.01)
(52) U.S. Cl. ............. 257/500; 257/501; 257/396; 257/E29.26
(58) Field of Classification Search .......... 257/350, 257/395–397, 500, 501, E29.26
See application file for complete search history.

(56) References Cited
U.S. PATENT DOCUMENTS
5,783,491 A  *  7/1998  Nakamura et al. .......... 438/702
(Continued)

FOREIGN PATENT DOCUMENTS
CN       1302088 A       7/2001
(Continued)

OTHER PUBLICATIONS
English language abstract of China Publication CN1302088A, Jul. 4, 2001.

*Primary Examiner*—Matthew E Warren
(74) *Attorney, Agent, or Firm*—Marger Johnson & McCollom, P.C.

(57) ABSTRACT

Methods of fabricating a semiconductor device having multi-gate insulation layers and semiconductor devices fabricated thereby are provided. The method includes forming a pad insulation layer and an initial high voltage gate insulation layer on a first region and a second region of a semiconductor substrate respectively. The initial high voltage gate insulation layer is formed to be thicker than the pad insulation layer. A first isolation layer that penetrates the pad insulation layer and is buried in the semiconductor substrate is formed to define a first active region in the first region, and a second isolation layer that penetrates the initial high voltage gate insulation layer and is buried in the semiconductor substrate is formed to define a second active region in the second region. The pad insulation layer is then removed to expose the first active region. A low voltage gate insulation layer is formed on the exposed first active region. Accordingly, it can minimize a depth of recessed regions (dent regions) to be formed at edge regions of the first isolation layer during removal of the pad insulation layer, and it can prevent dent regions from being formed at edge regions of the second isolation layer.

8 Claims, 20 Drawing Sheets

U.S. PATENT DOCUMENTS

| | | |
|---|---|---|
| 6,222,225 B1 | 4/2001 | Nakamura et al. |
| 6,518,635 B1 * | 2/2003 | Shiozawa et al. ........... 257/410 |
| 6,642,105 B2 * | 11/2003 | Kim et al. ................... 438/257 |
| 6,921,947 B2 * | 7/2005 | Furuta et al. ................ 257/368 |
| 2004/0129995 A1 * | 7/2004 | Yeo et al. .................... 257/500 |
| 2005/0199914 A1 * | 9/2005 | Chen et al. .................. 257/209 |

FOREIGN PATENT DOCUMENTS

| | | |
|---|---|---|
| JP | 08-064697 | 3/1996 |
| KR | 2001-0111743 | 12/2001 |

* cited by examiner

METHODS OF FABRICATING A SEMICONDUCTOR DEVICE HAVING MULTI-GATE INSULATION LAYERS AND SEMICONDUCTOR DEVICES FABRICATED THEREBY

CROSS-REFERENCE TO RELATED APPLICATION

This application claims priority from Korean Patent Application No. 2003-3093 and 2003-53551, filed on Jan. 16, 2003 and Aug. 1, 2003, respectively, the contents of both of which are herein incorporated by reference in their entirety.

BACKGROUND OF THE INVENTION

1. Field of the Invention

This disclosure relates to fabrication methods of a semiconductor device and, more particularly, to fabrication methods of a semiconductor device having multi-gate insulation layers and semiconductor devices fabricated thereby.

2. Description of Related Art

As semiconductor devices become more highly integrated, a trench isolation technique has been widely used in order to separate the adjacent discrete devices. The trench isolation technique includes etching a predetermined region of a semiconductor substrate to form a trench region and forming an isolation layer that fills the trench region.

FIGS. 1 to 3 are cross sectional views for illustrating a conventional trench isolation technique.

Referring to FIG. 1, a pad oxide layer 3 and a pad nitride layer 5 are sequentially formed on a semiconductor substrate 1. The semiconductor substrate 1 has a low voltage MOS transistor region A and a high voltage MOS transistor region B. The low voltage MOS transistor region A may be a portion of a cell array region in a flash memory device or a portion of a peripheral circuit region in the flash memory device. The pad nitride layer 5 and the pad oxide layer 3 are patterned to expose predetermined regions of the semiconductor substrate 1. The exposed semiconductor substrate 1 is etched using the patterned pad nitride layer 5 as an etching mask. As a result, first trench regions 9a are formed in the low voltage MOS transistor region A, and second trench regions 9b are formed in the high voltage MOS transistor region B. The first trench regions 9a define first active regions 7a in the low voltage MOS transistor region A, and the second trench regions 9b define second active regions 7b in the high voltage MOS transistor region B. First and second isolation layers 11a and 11b are formed in the first and second trench regions A and B, respectively. The first and second isolation layers 11a and 11b are formed of a silicon oxide layer.

Referring to FIG. 2, the patterned pad nitride layer 5 and the patterned pad oxide layer 3 shown in FIG. 1 are removed using a wet etching technique, thereby exposing the first and second active regions 7a and 7b. As a result, first recessed regions 13, i.e., dent regions are formed at edges of the first and second isolation layers 11a and 11b. The substrate having the first recessed regions 13 is then thermally oxidized to form a first gate oxide layer 15 on the exposed active regions 7a and 7b. The first gate oxide layer 15 on the second active regions 7b exists even though subsequent processes are performed, and the first gate oxide layer 15 acts as a gate insulating layer of a high voltage MOS transistor. The thicker the first gate oxide layer 15 is, the thinner the first gate oxide layer on the edge corners of the second active regions 7b is, relatively. This phenomenon is called "thinning effect".

Referring to FIG. 3, the first gate oxide layer 15 in the low voltage MOS transistor region A is selectively removed to expose the first active regions 7a. As a result, second recessed regions 13a, which are deeper than the first recessed regions 13, are formed at the edges of the fist isolation layers 11a. The substrate having the second recessed regions 13a is then thermally oxidized to form a second gate oxide layer 17, which is thinner than the first gate oxide layer 15, on the first active regions 7a. The first gate oxide layer 15 on the second active regions 7b is hardly grown during formation of the second gate oxide layer 17. Accordingly, the first gate oxide layer 15 has almost the same thickness as the initial thickness thereof. Nevertheless, the first recessed regions 13 still exist at the edges of the second isolation layers 11b, and the second recessed regions 13a, which are deeper than the first recessed regions 13, also exist at the edges of the first isolation layers 11a.

A gate conductive layer 19 is formed on an entire surface of the semiconductor substrate including the second gate oxide layer 17. As a result, the first gate oxide layer 15 acts as a gate insulating layer of a high voltage MOS transistor, and the second gate oxide layer 17 acts as a gate insulating layer of a low voltage MOS transistor. The gate conductive layer 19 is then patterned to form first gate electrodes (not shown) that cross over the first active regions 7a and second gate electrodes (not shown) that cross over the second active regions 7b.

According to the foregoing conventional art, the first recessed regions are formed at the edges of the second isolation layers in the high voltage MOS transistor region, and the second recessed regions, which are deeper than the first recessed regions, are formed at the edges of the first isolation layers in the low voltage MOS transistor region. Accordingly, subthreshold characteristics of the high voltage MOS transistor as well as the low voltage MOS transistor are remarkably degraded. In particular, a breakdown voltage of the gate oxide layer of the high voltage MOS transistor is remarkably lowered, since the first gate oxide layer 15 covering the edge corners of the second active regions 7b is relatively thinner than that on the central regions of the second active regions 7b. As a result, reliability of the high voltage MOS transistor is degraded.

To address this problem, a self-aligned trench isolation technique has been proposed in order to prevent the recessed regions from being formed. The self-aligned trench isolation technique is taught in U.S. Pat. No. 6,222,225 to Nakamura et al., entitled "Semiconductor device and manufacturing method thereof".

FIGS. 4 to 7 are cross sectional views for illustrating the self-aligned trench isolation technique described in the U.S. Pat. No. 6,222,225, and FIG. 8 is an overhead view for showing a problem that may occur in the self-aligned trench isolation technique according to the U.S. Pat. No. 6,222,225.

Referring to FIG. 4, a gate insulation layer, a first floating gate layer and a silicon nitride layer are sequentially formed on a semiconductor substrate 21. The silicon nitride layer, the first floating gate layer and the gate insulation layer are successively patterned to expose predetermined regions of the semiconductor substrate 21. The exposed semiconductor substrate 21 is selectively etched to form trench regions 23 that define active regions 22. As a result, a tunnel oxide layer 25, a first floating gate pattern 26a and a polishing stop layer pattern 41, which are sequentially stacked, are formed on each of the active regions 22. An insulation layer 24 is formed in the trench regions 23 and on the polishing stop layer patterns 41.

Referring to FIG. 5, the insulation layer 24 is planarized until the polishing stop layer patterns 41 (not indicated in FIG. 5) are exposed, thereby forming isolation layers 24a in the trench regions 23. The exposed polishing stop layer patterns 41 are selectively removed to expose the first floating gate patterns 26a. As a result, the isolation layers 24a are relatively protruded from the top surfaces of the first floating gate patterns 26a. In addition, the protrusions of the isolation layers 24a have negative sloped sidewalls as shown in FIG. 5. In other words, the sidewalls of the protrusions exhibit inverted tapered shape. The negative sloped sidewalls may lead to difficulties in subsequent processes.

Referring to FIG. 6, the isolation layers 24a are isotropically etched to convert their sidewall profiles into a positive sloped shape. As a result, recessed regions R are formed at edges of the isolation layers 24a as shown in FIG. 6. Here, the isotropic etching is appropriately performed so that the recessed regions R do not expose the tunnel oxide layer 25. Thus, the recessed regions R do not affect the subthreshold characteristic of a MOS transistor.

Referring to FIG. 7, a second floating gate layer is formed on an entire surface of the substrate having the recessed regions R. The second floating gate layer is patterned to form second floating gate patterns 26b that cover the active regions 22. The first and second floating gate patterns 26a and 26b, which are sequentially stacked on each of the active regions 22, constitute a floating gate pattern 26. An inter-gate dielectric layer 27 and a control gate electrode layer are sequentially formed on an entire surface of the substrate having the floating gate patterns 26.

Subsequently, the control gate electrode layer, the inter-gate dielectric layer 27 and the floating gate patterns 26 are successively patterned to form control gate electrodes 28 crossing over the active regions 22 as well as floating gates 26 interposed between the control gates 28 and the active regions 22. During formation of the control gate electrodes 28 and the floating gates 26, stringers S may be formed at edges of the isolation layers 24a between the adjacent control gate electrodes 28 as shown in FIG. 8. The stringers S are formed in the recessed regions R shown in FIG. 6. That is, the stringers correspond to residues of the second floating gate patterns 26b.

As described above, the isolation layers fabricated according to the conventional trench isolation technique and the conventional self-aligned trench isolation technique may exhibit various problems.

Embodiments of the invention address these and other limitations in the prior art.

SUMMARY OF THE INVENTION

Embodiments of the invention provide manufacturing methods of a semiconductor device having multi-gate insulation layers that are capable of preventing recessed regions from being formed at edges of isolation layers adjacent to a gate insulation layer of a high voltage MOS transistor, and semiconductor devices fabricated thereby.

Embodiments of the invention also provide a manufacturing method of a semiconductor device having multi-gate insulation layers that is capable of minimizing a depth of recessed regions to be formed at edges of isolation layers adjacent to a gate insulation layer of a low voltage MOS transistor, and semiconductor devices fabricated thereby.

Also provided is a manufacturing method of a semiconductor device having multi-gate insulation layers that is basically capable of preventing recessed regions from being formed at edges of isolation layers.

BRIEF DESCRIPTION OF THE DRAWINGS

Other features and advantages of the present invention will be more readily understood from the following detailed description of specific embodiments thereof when read in conjunction with the accompanying drawings, in which.

DESCRIPTION OF THE PREFERRED EMBODIMENT

Figure 1:
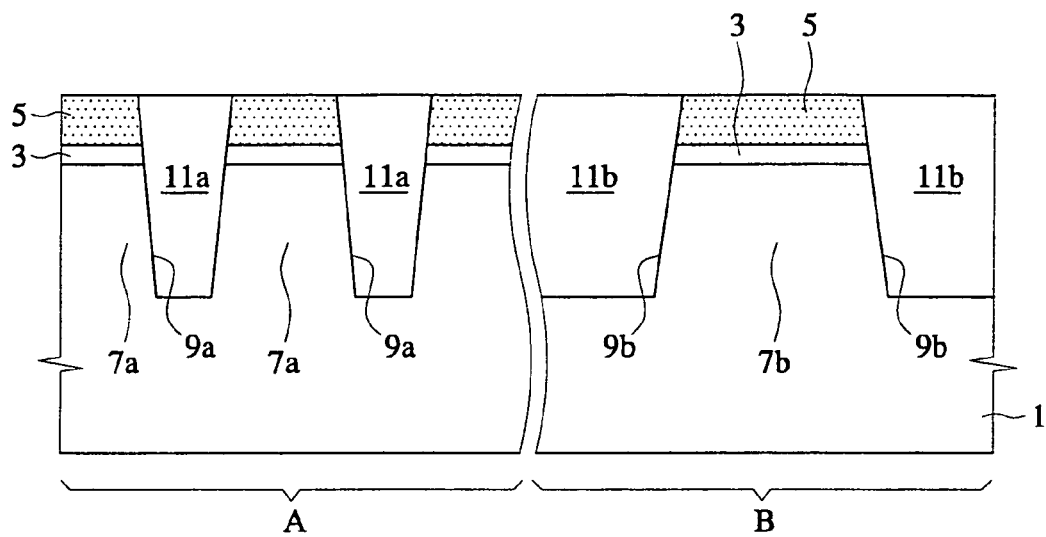
FIGS. 1 to 3 are cross sectional views for illustrating a conventional trench isolation technique.
Figure 2:
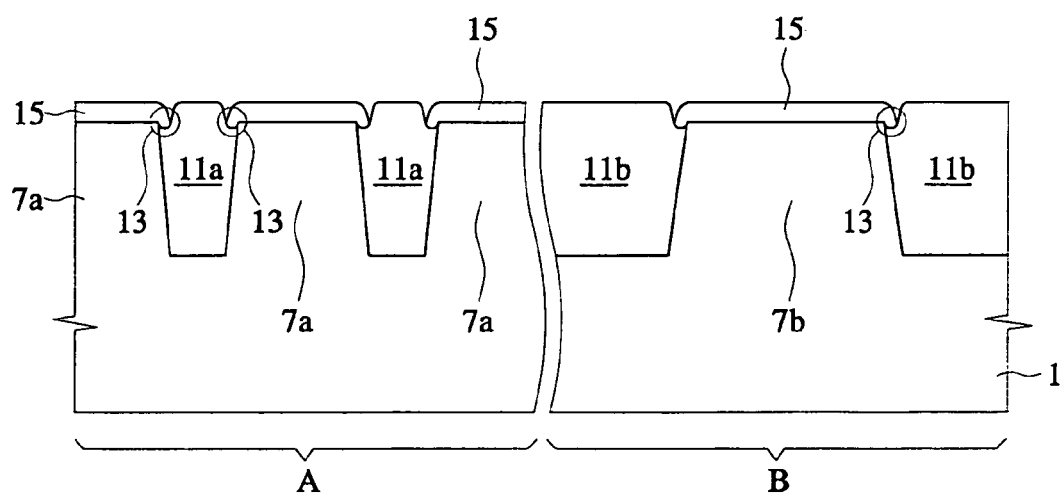
Figure 3:
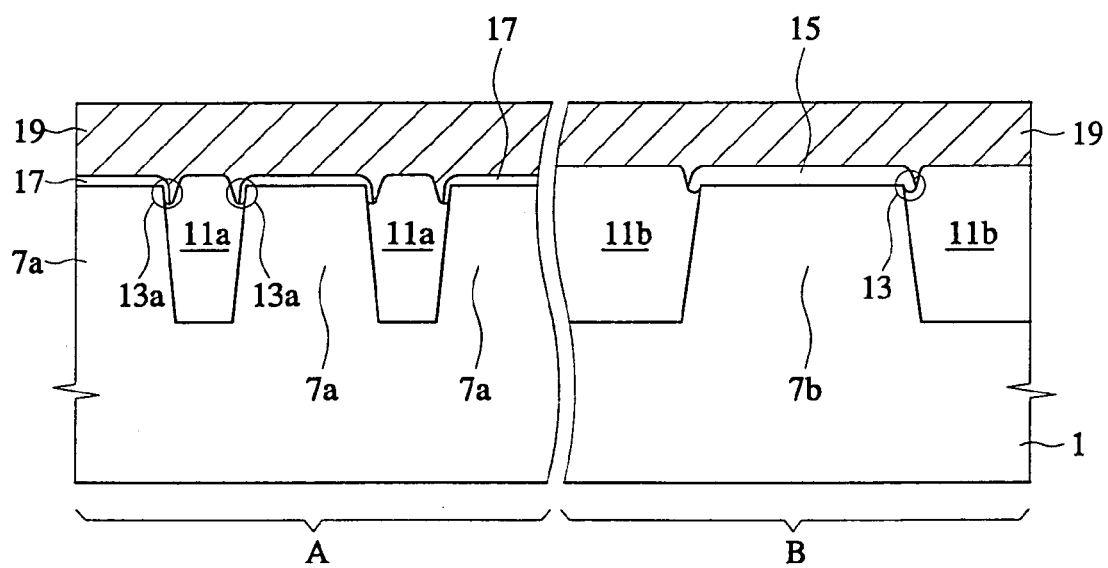
Figure 4:
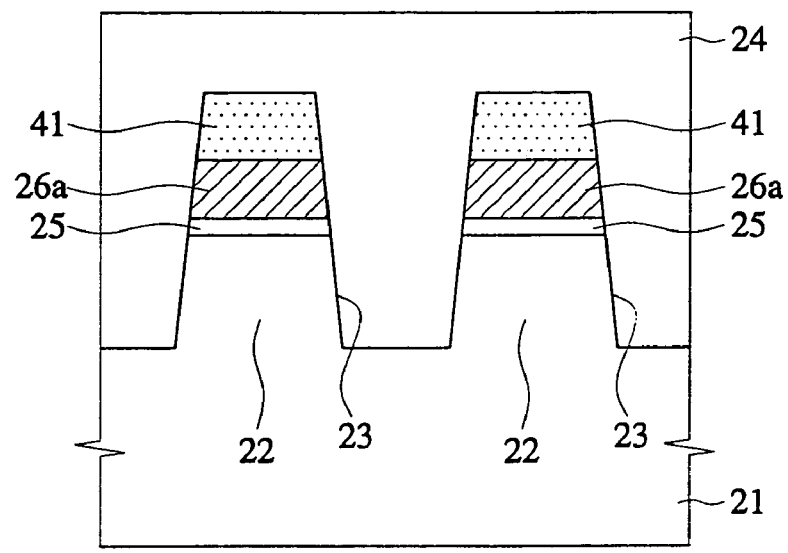
FIGS. 4 to 7 are cross sectional views for illustrating another conventional trench isolation technique.
Figure 5:
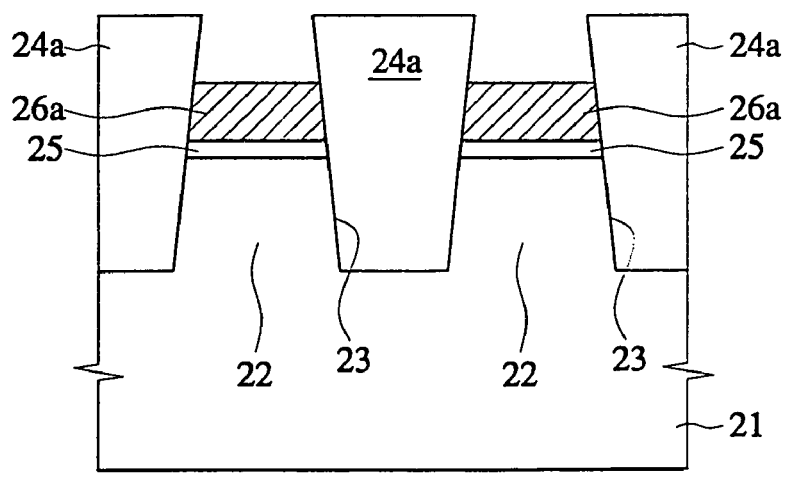
Figure 6:
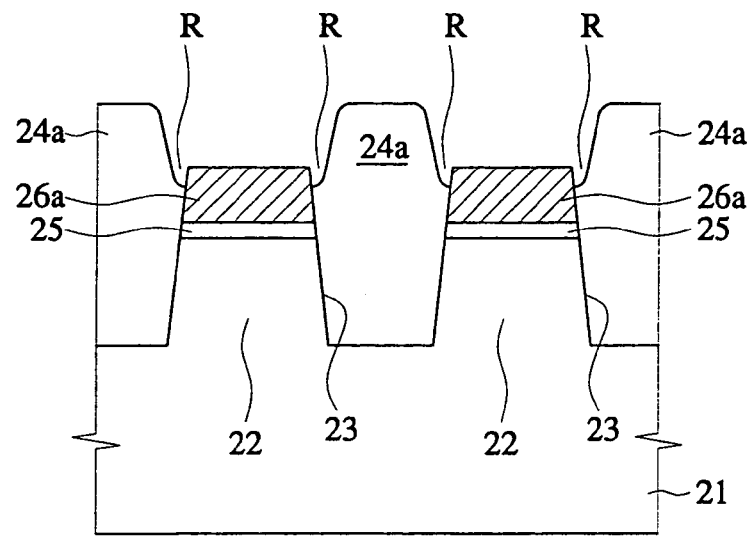
Figure 7:
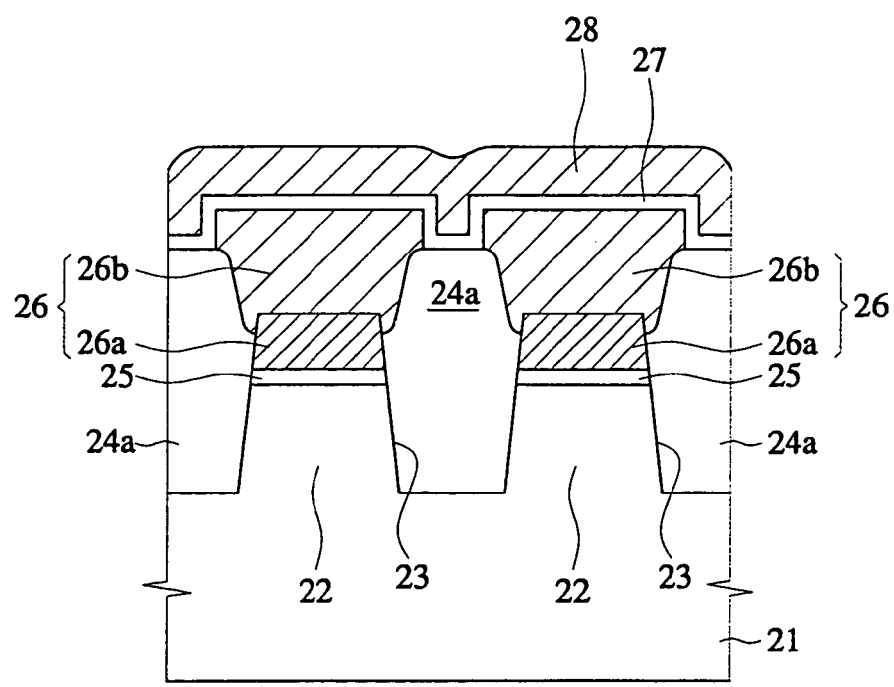
Figure 8:
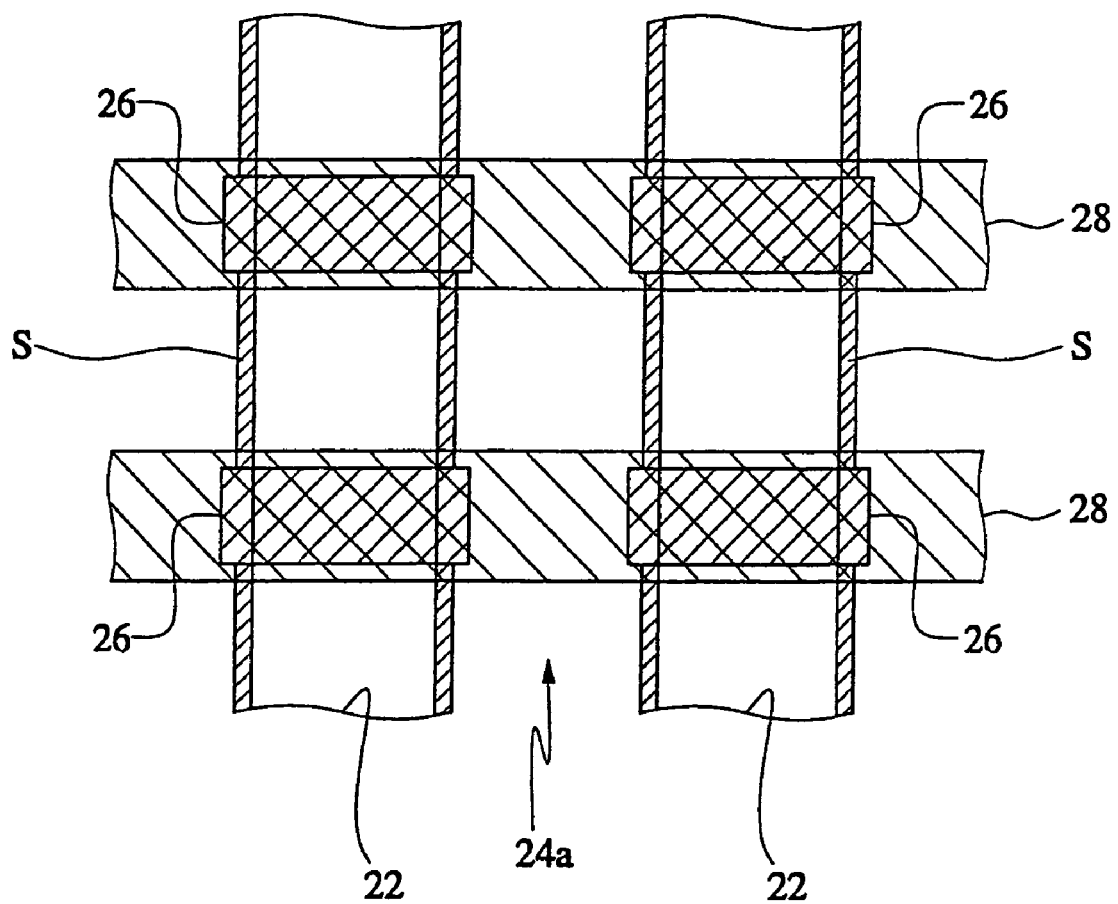
FIG. 8 is a top view for illustrating problems of the conventional trench isolation technique shown in FIG. 7.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. It will also be understood that when a layer is referred to as being "on" another layer or substrate, it can be directly on the other layer or substrate, or intervening layers may also be present. Like numbers refer to like elements throughout the specification.

FIGS. 9 to 13 are cross sectional views for illustrating a manufacturing method of a semiconductor device according to an embodiment of the present invention.

Figure 9:
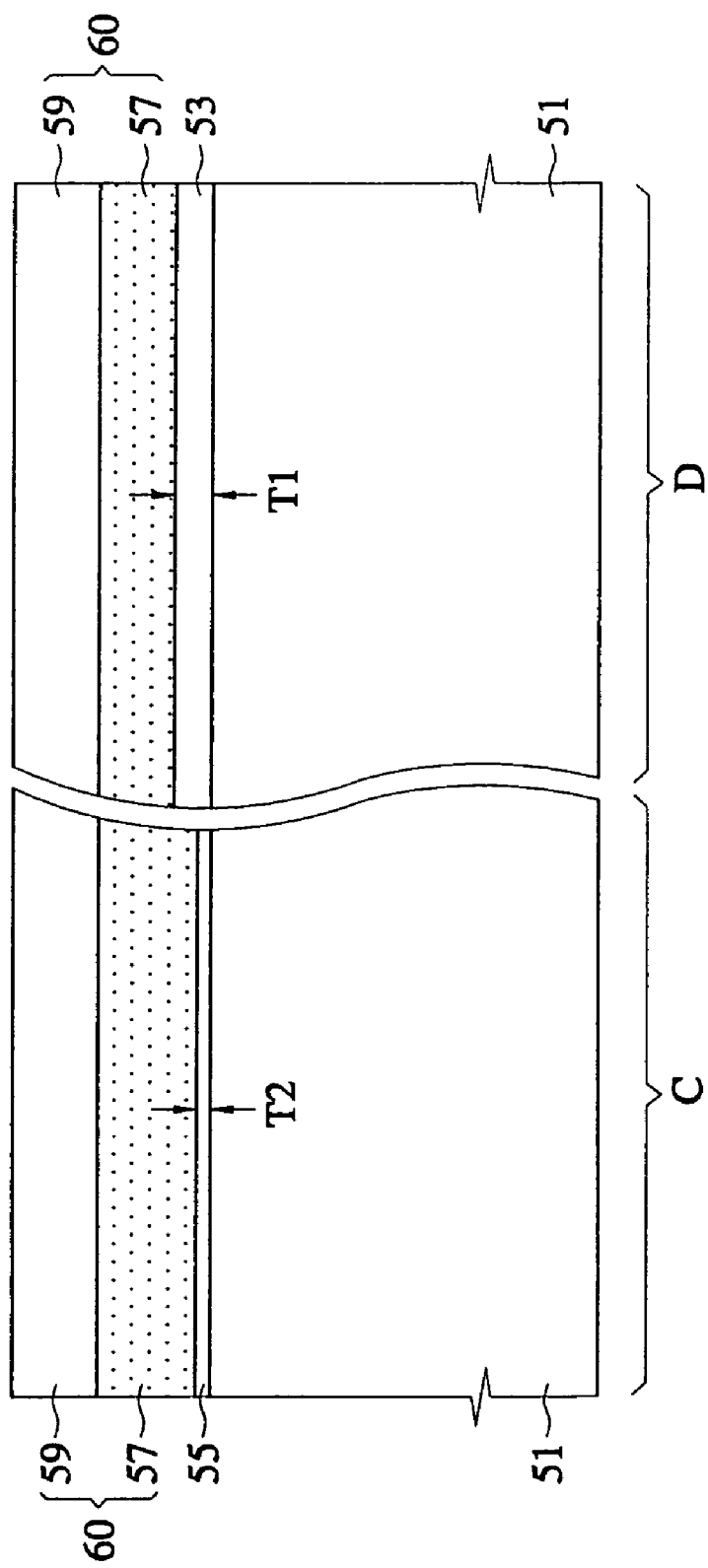
FIGS. 9 to 13 are cross sectional views for illustrating a manufacturing method of a semiconductor device according to an embodiment of the present invention.

Referring to FIG. 9, a semiconductor substrate 51 having a low voltage region C and a high voltage region D is provided. The low voltage region C may correspond to a memory cell array region, and the high voltage region D may correspond to a high voltage MOS transistor region of a peripheral circuit region, for instance. Alternatively, the low voltage region C may correspond to a low voltage MOS transistor region of the peripheral circuit region. The semiconductor substrate 51 may be a silicon wafer. An initial high voltage gate insulation layer 53 having a first thickness T1 is formed on an entire surface of the semiconductor substrate 51. The initial high voltage gate insulation layer 53 is preferably formed of a thermal oxide layer. The first thickness T1 is preferably greater than a final thickness thereof. For example, if a high voltage gate insulation layer having a final thickness of 400 angstrom is required, the first thickness T1 is preferably formed within the range of about 450 angstrom to 500 angstrom. This is because the initial high voltage gate insulation layer 53 may be etched in a subsequent wet etching process.

The initial high voltage gate insulation layer 53 is selectively patterned to expose the semiconductor substrate 51 in the low voltage region C. The process for patterning the initial high voltage gate insulation layer 53 includes forming a photoresist pattern (not shown) that selectively covers the initial high voltage gate insulation layer 53 in the high voltage region D, etching the initial high voltage gate insulation layer 53 in the low voltage region C using the photoresist pattern as an etching mask, and removing the photoresist pattern. Here, the initial high voltage gate insulation layer 53 is preferably etched using a wet etching technique.

A pad insulation layer 55 is formed on the exposed semiconductor substrate 51 in the low voltage region C. The pad insulation layer 55 is preferably formed to a second thickness T2, which is less than the first thickness T1. For example, when the first thickness T1 is about 450 angstroms, the second thickness T2 is preferably less than 100 angstroms. Also, the pad insulation layer 55 is preferably formed of a thermal oxide layer. The thickness of the initial high voltage gate insulation layer 53 (e.g., the first thickness T1) is hardly increased during formation of the pad oxide layer 55. This is because an oxidation rate of the semiconductor substrate 51 in the high voltage region D is very low due to the presence of the initial high voltage gate insulation layer 53.

A hard mask layer 60 is formed on an entire surface of the substrate where the pad insulation layer 55 is formed. The hard mask layer 60 is formed by sequentially stacking a lower hard mask layer 57 and an upper hard mask layer 59. In this case, the lower hard mask layer 57 is preferably formed of a first material layer that has an etch selectivity with respect to the pad insulation layer 55, the initial high voltage gate insulation layer 53 and the semiconductor substrate 51, and the upper hard mask layer 59 is preferably formed of a second material layer that has an etch selectivity with respect to the semiconductor substrate 51. For example, the first and second material layers are formed of a silicon oxide layer and a silicon nitride layer respectively.

Alternatively, the hard mask layer 60 may be formed of a single layer of material that has an etch selectivity with respect to the pad insulation layer 55, the initial high voltage gate insulation layer 53 and the semiconductor substrate 51. In other words, the hard mask layer 60 can be formed of only the lower hard mask layer 57. That is, it is able to omit the process for forming the upper hard mask layer 59.

Figure 10:
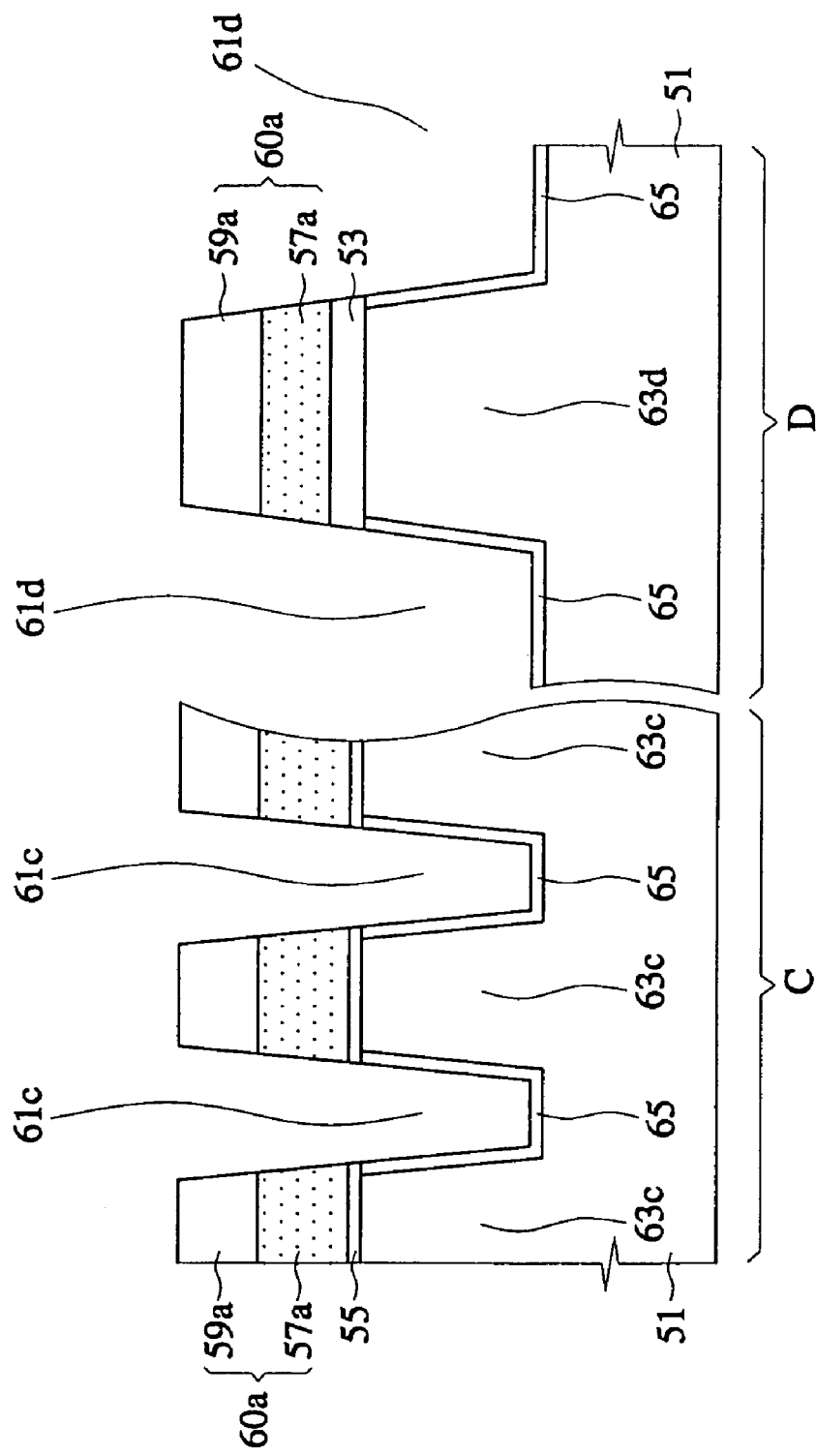

Referring to FIG. 10, the hard mask layer 60 is patterned to a plurality of hard mask patterns 60a. As a result, each of the hard mask patterns 60a is composed of a lower hard mask pattern 57a and an upper hard mask pattern 59a, which are sequentially stacked, or only the lower hard mask pattern 57a. The initial high voltage gate insulation layer 53, the pad insulation layer 55 and the semiconductor substrate 51 are then etched using the hard mask patterns 60a as etching masks, thereby forming first trench regions 61c and second trench regions 61d in the low voltage region C and the high voltage region D respectively. The first trench regions 61c define first active regions 63c in the low voltage region C, and the second trench regions 61d define second active regions 63d in the high voltage region D. It is preferable that the substrate having the trench regions 61c and 61d is thermally oxidized to form a thermal oxide layer 65 at inner walls of the trench regions 61c and 61d. The process for forming the thermal oxide layer 65 is performed in order to cure etching damage applied to the inner walls of the trench regions 61c and 61d during formation of the trench regions 61c and 61d.

Figure 11:
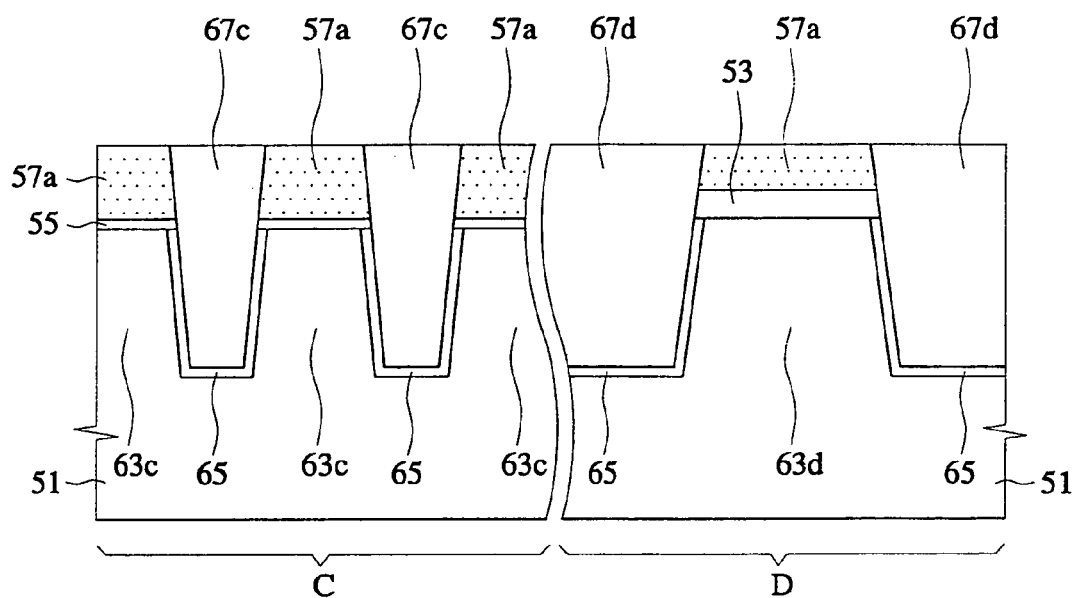

Referring to FIG. 11, an insulation layer is formed on the substrate having the first and second trench regions 61c and 61d. The insulation layer is preferably formed of a CVD (chemical vapor deposition) oxide layer such as a HDP (high density plasma) oxide layer or a HTO (high temperature oxide) layer. Also, the insulation layer is preferably formed to completely fill the trench regions 61c and 61d. The insulation layer is planarized until the hard mask patterns 60a are exposed, thereby forming first isolation layers 67c and second isolation layers 67d in the first and second trench regions 61c and 61d respectively. It is preferable that the planarization process is performed using a chemical mechanical polishing (CMP) technique. In this case, the upper hard mask patterns 59a may be removed during the CMP process. As a result, the lower hard mask patterns 57a act as a polishing stopper layer during the CMP process.

Figure 12:
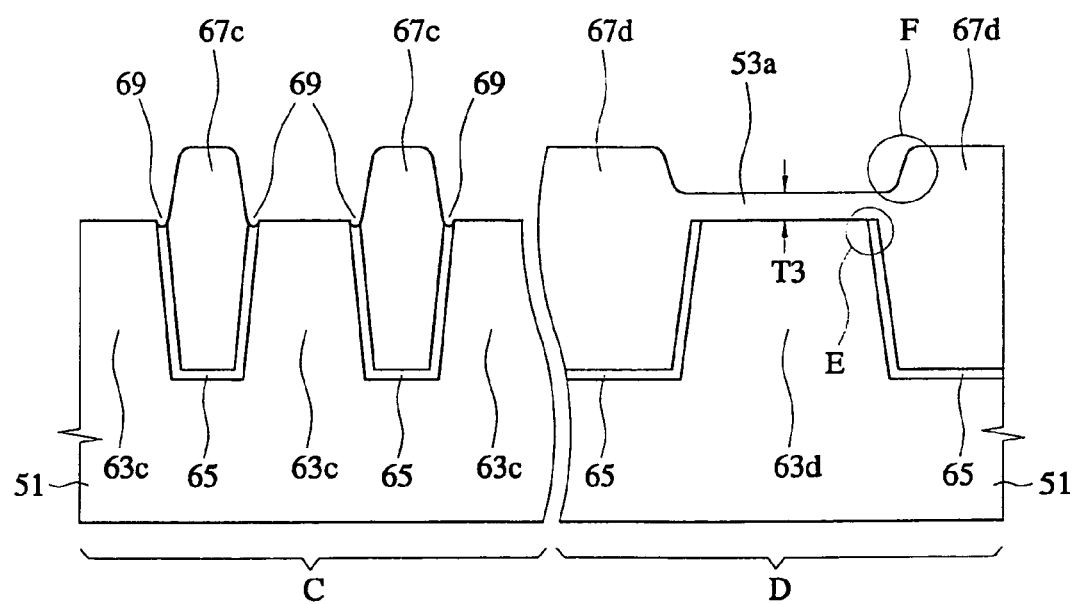

Referring to FIG. 12, the lower hard mask patterns 57a are selectively removed using phosphoric acid (H3PO4) to expose the initial high voltage gate insulation layer 53 and the pad insulation layer 55. The exposed pad insulation layer 55 is then removed to expose the first active regions 63c. Accordingly, the first isolation layers 67c may be over-etched. As a result, dent regions 69 may be formed at edges of the first isolation layers 67c as shown in FIG. 12. However, in this embodiment, the dent regions 69 are relatively shallow as compared to the conventional art. This is because the first isolation layers 67c are etched only during removal of the pad insulation layer 55 having a thickness of 100 angstrom or the less.

If the initial high voltage gate insulation layer 53 and the pad insulation layer 55 are formed of a silicon oxide layer, e.g., a thermal oxide layer, the pad insulation layer 55 may be removed using an oxide etchant such as a buffer oxide etchant (BOE) or a hydrofluoric acid (HF) solution. In this case, the initial high voltage gate insulation layer 53 is also etched. Thus, a final high voltage gate insulation layer 53a having a third thickness T3, which is less than the first thickness T1, exists on the second active regions 63d.

Top surfaces of the first and second isolation layers 67c and 67d have a higher level than the top surfaces of the initial high voltage gate insulation layer 53. Accordingly, step regions F exist at border regions between the final high voltage gate insulation layer 53a and the second isolation layers 67d. In particular, the first and second isolation layers 67c and 67d are vertically and laterally etched during removal of the pad insulation layer 55. Thus, the step regions F move laterally from the positions over the edge corners E of the second active regions 63d into the second isolation layers 67d adjacent to the edge corners E. As a result, the top surface of the final high voltage gate insulation layer 53a has a greater width than the second active region 63d thereunder. Also, there is no dent region formed at edges of the second isolation layers 67d during removal of the pad insulation layer 55. This is because the initial high voltage gate insulation layer 53 is much thicker than the pad insulation layer 55.

Figure 13:
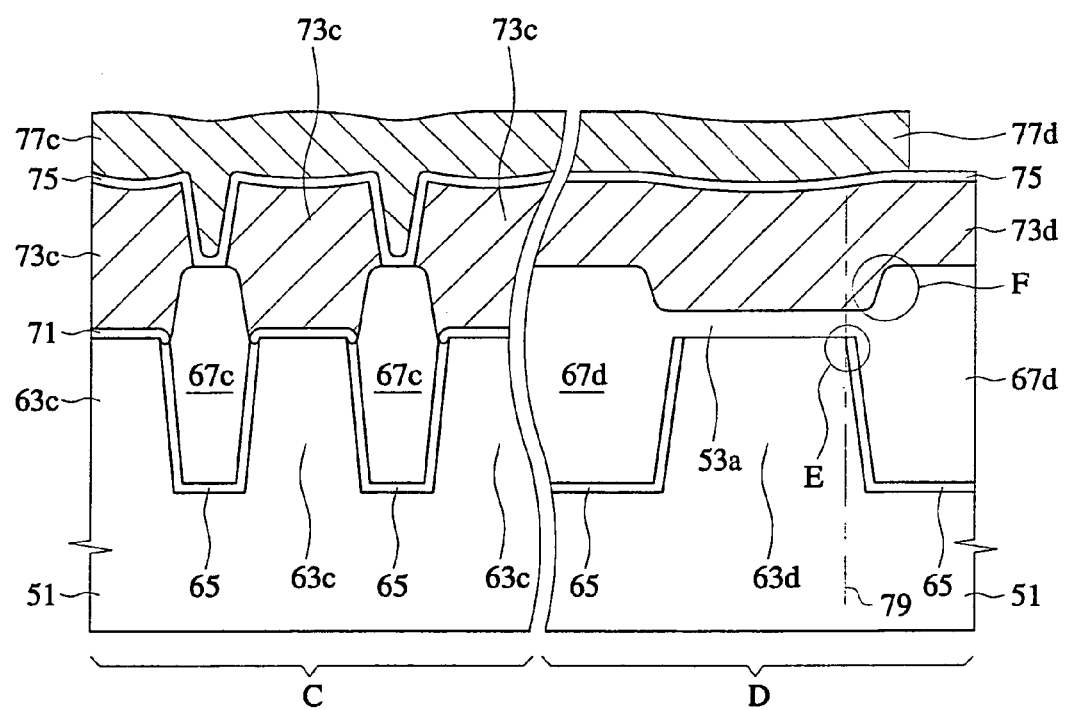

Referring to FIG. 13, a low voltage gate insulation layer 71, which is thinner than the initial high voltage gate insulation layer 53, is formed on the first active regions 63c. In more detail, the low voltage gate insulation layer 71 is thinner than the final high voltage gate insulation layer 53a. Also, it is preferable that the low voltage gate insulation layer 71 is formed of a thermal oxide layer. In this case, the thickness of the final high voltage gate insulation layer 53a (e.g., the third thickness T3) is hardly changed. A first conductive layer is formed on an entire surface of the substrate having the low voltage gate insulation layer 71.

When the low voltage region C corresponds to a cell array region of a flash memory device and the high voltage region D corresponds to a high voltage MOS transistor region in a peripheral circuit region of the flash memory device, the low voltage gate insulation layer 71 is a tunnel oxide layer. In this case, the first conductive layer is patterned to form floating gate patterns covering the first active regions 63c and a main gate pattern covering the high voltage region D. An inter-gate dielectric layer 75 and a second conductive layer are sequentially formed on an entire surface of the substrate having the floating gate patterns and the main gate pattern. The second conductive layer, the inter-gate dielectric layer 75, the floating gate patterns and the main gate pattern are then patterned to form a control gate electrode 77c crossing over the first active regions 63c and floating gates 73c interposed between the control gate electrode 77c and the low voltage gate insulation layer 71. At the same time, a main gate electrode 73d and a dummy gate electrode 77d, which are sequentially stacked, are formed in the high voltage region D. The main gate electrode 73d and the dummy gate electrode 77d are formed to cross over the second active region 63d.

Meanwhile, when the low voltage region C corresponds to a low voltage MOS transistor region of a non-memory semiconductor device and the high voltage region D corresponds to a high voltage MOS transistor region of the non-memory semiconductor device, the first conductive layer is patterned to form low voltage gate electrodes (73c of FIG. 13) crossing over the first active regions 63c and a high voltage gate electrode (73d of FIG. 13) crossing over the second active region 63d. In this case, the processes for forming the inter-gate dielectric layer 75 and the second conductive layer are omitted.

Now, a semiconductor device fabricated according to the above-described embodiment of the present invention will be described.

Referring to FIG. 13 again, a semiconductor substrate 51 has a low voltage region C and a high voltage region D. First isolation layers 67c are disposed at predetermined regions of the semiconductor substrate 51 in the low voltage region C. Also, second isolation layers 67d are disposed at predetermined regions of the semiconductor substrate 51 in the high voltage region D. The first isolation layers 67c define first active regions 63c in the low voltage region C, and the second isolation layers 67d define second active regions 63d in the high voltage region D. The first active regions 63c are covered with a low voltage gate insulation layer 71. Similarly, the second active regions 63d are covered with a high voltage gate insulation layer 53a, which is thicker than the low voltage gate insulation layer 71. Top surfaces of the first and second isolation layers 67c and 67d are higher than top surfaces of the low voltage gate insulation layer 71 and the high voltage gate insulation layer 53a. As a result, step regions F exist at border regions between the high voltage gate insulation layer 53a and the second isolation layers 67d.

The step regions F are located at positions that are spaced apart laterally from vertical axes 79 passing through edge corners of the second active regions 63d toward the second isolation layers 67d adjacent to the vertical axes 79, as shown in FIG. 13. In other words, a top surface of the high voltage gate insulation layer 53a has a wider width than the second active region 63d thereunder. Also, the step regions F, e.g., the edge regions of the second isolation layers 67d do not have any dent regions (recessed regions) which are lower than the top surface of the high voltage gate insulation layer 53a. On the contrary, the first isolation layers 67c may have shallow dent regions, which are formed at the edge regions thereof. In other words, the edge regions of the first isolation layers 67c may be lower than the top surface of the low voltage gate insulation layer 71.

When the low voltage region C corresponds to a cell array region of a flash memory device and the high voltage region D corresponds to a high voltage MOS transistor region in a peripheral circuit region of the flash memory device, a control gate electrode 77c is disposed across the first active regions 63c and floating gates 73c are interposed between the control gate electrode 77c and the low voltage gate insulation layer 71. In addition, a main gate electrode 73d and a dummy gate electrode 77d, which are sequentially stacked, are placed on the high voltage gate insulation layer 53a. The main gate electrode 73d and the dummy gate electrode 77d cross over the second active region 63d. An inter-gate dielectric layer 75 is interposed between the floating gates 73c and the control gate electrode 77c. Also, the inter-gate dielectric layer 75 is interposed between the main gate electrode 73d and the dummy gate electrode 77d. In the high voltage region D, the dummy gate electrode 77d may be in direct contact with the top surface of the main gate electrode 73d.

Meanwhile, when the low voltage region C corresponds to a low voltage MOS transistor region of a non-memory semiconductor device and the high voltage region D corresponds to a high voltage MOS transistor region of the non-memory semiconductor device, low voltage gate electrodes (73c of FIG. 13) crossing over the first active regions 63c are disposed on the low voltage gate insulation layer 63c and a high voltage gate electrode (73d of FIG. 13) is disposed on the high voltage gate insulation layer 53a. In this case, embodiments would not include the inter-gate dielectric layer 75, the control gate electrode 77c or the dummy gate electrode 77d shown in FIG. 13.

Further, a thermal oxide layer 65 may be interposed between the isolation layers 67c and 67d and the semiconductor substrate 51.

FIGS. 14 to 18 are cross sectional views for illustrating a method of fabricating a semiconductor device according to another embodiment of the present invention.

Figure 14:
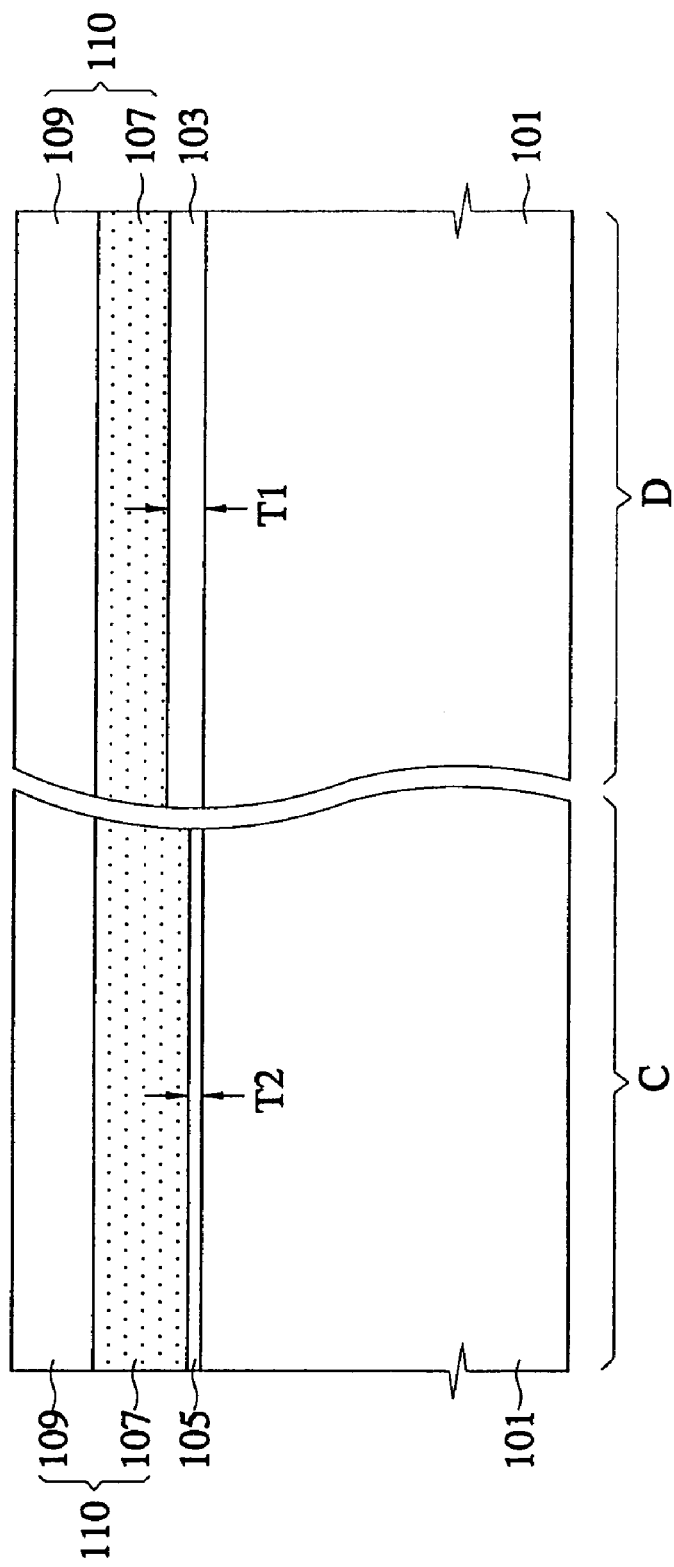
FIGS. 14 to 18 are cross sectional views for illustrating a manufacturing method of a semiconductor device according to another embodiment of the present invention.

Referring to FIG. 14, an initial high voltage gate insulation layer 103 having a first thickness T1, a pad insulation layer 105 having a second thickness T2 that is less than the first thickness T1, and a hard mask layer 110 are formed on the substrate including a low voltage region C and a high voltage region D using the same manners as the above embodiment. The hard mask layer 110 is formed using the same manner as described above also. In other words, the hard mask layer 110 may be formed by sequentially stacking a lower hard mask layer 107 and an upper hard mask layer 109 or formed of only the lower hard mask layer 107.

Figure 15:
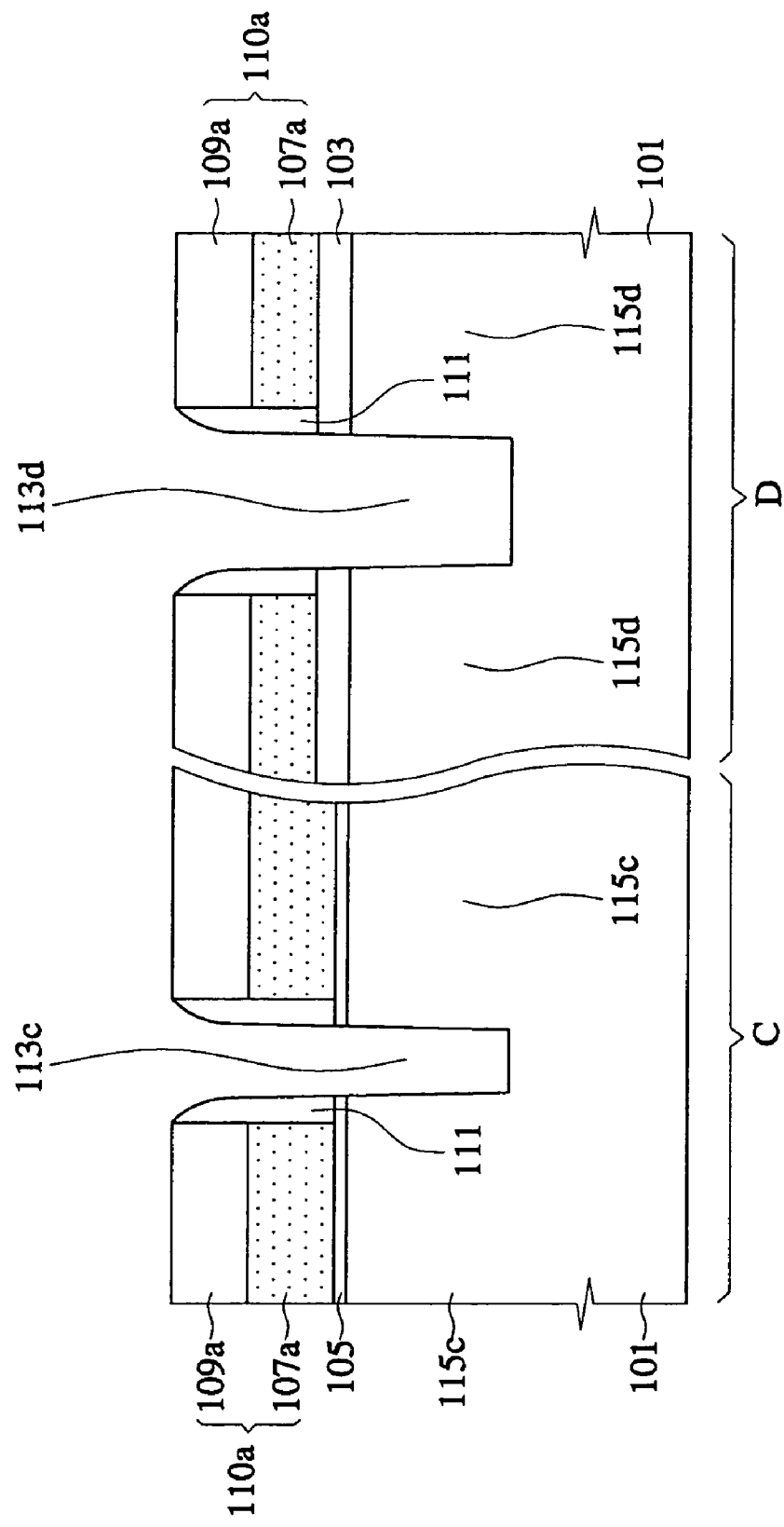

Referring to FIG. 15, the hard mask layer 110 is patterned to form a number of hard mask patterns 110a in the low voltage region C and the high voltage region D. Accordingly, each of the hard mask patterns 110a may be composed of a lower hard mask pattern 107a and an upper hard mask pattern 109a or only the lower hard mask pattern 107a. Spacers 111 are formed on sidewalls of the hard mask patterns 110a. The spacers 111 may be formed of a silicon oxide layer or a silicon nitride layer. The pad insulation layer 105, the initial high voltage gate insulation layer 103 and the semiconductor substrate 101 are etched using the hard mask patterns 110a and the spacers 111 as etching masks, thereby forming first trench regions 113c and second trench regions 113d in the low voltage region C and in the high voltage region D respectively. Therefore, first active regions 115c are defined in the low voltage region C, and second active regions 115d are defined in the high voltage region D.

Figure 16:
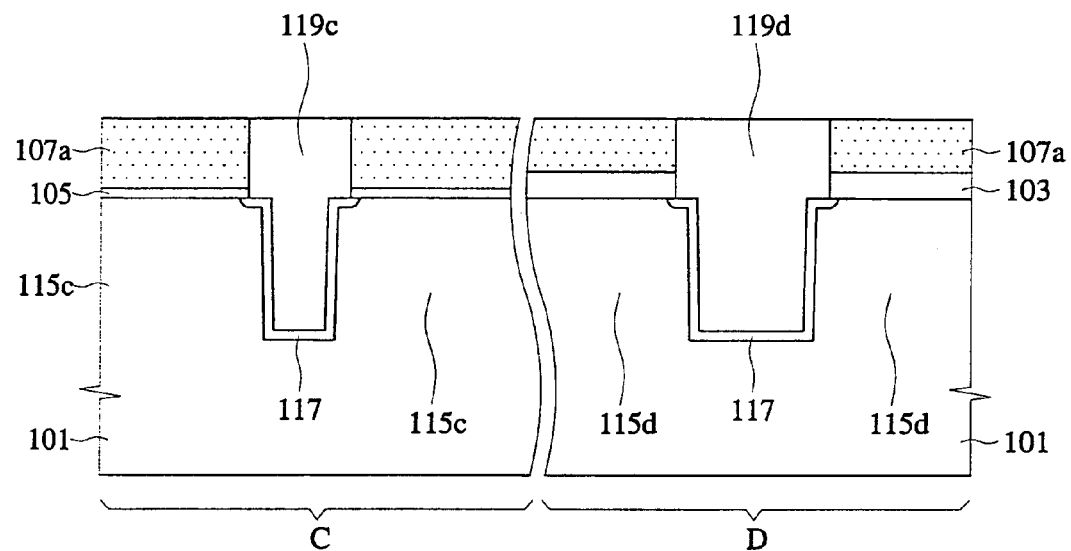

Referring to FIG. 16, the spacers 111 are removed. The spacers 111 are preferably removed using a wet etching technique. Using the same manner as described above, a thermal oxide layer 117 is formed at inner walls of the trench regions 113c and 113d, and first isolation layers 119c and second isolation layers 119d are formed in the first and second trench regions 113c and 113d respectively. As a result, the lower hard mask patterns 107a are exposed. In this case, edge regions of the first active regions 115c are covered with the first isolation layers 119c as shown in FIG. 16. Similarly, edge regions of the second active regions 115d are covered with the second isolation layers 119d as shown in FIG. 16. That is, upper regions of each of the first isolation layers 119c is wider than the first trench region 113c filled therewith, and upper regions of each of the second isolation layers 119d is wider than the second trench region 113d filled therewith.

Figure 17:
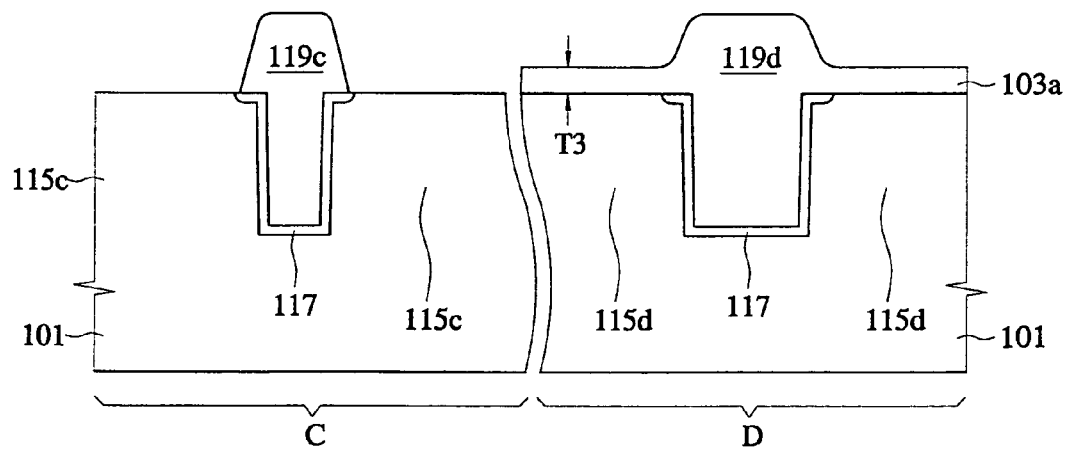

Referring to FIG. 17, the exposed lower hard mask patterns 107a and the pad insulation layer 105 are removed using the same method as described above. As a result, the first active regions 115c are exposed, and a final high voltage gate insulation layer 103a exists on the second active regions 115d. The final high voltage gate insulation layer 103a has a third thickness T3, which is less than the first thickness T1. At this time, no dent regions are formed at the edge regions of the second isolation layers 119d and the first isolation layers 119c. This is because the edge regions of the first and second active regions 115c and 115d are covered with the first and second isolation layers 119c and 119d prior to removal of the pad insulation layer 105, as described above.

Figure 18:
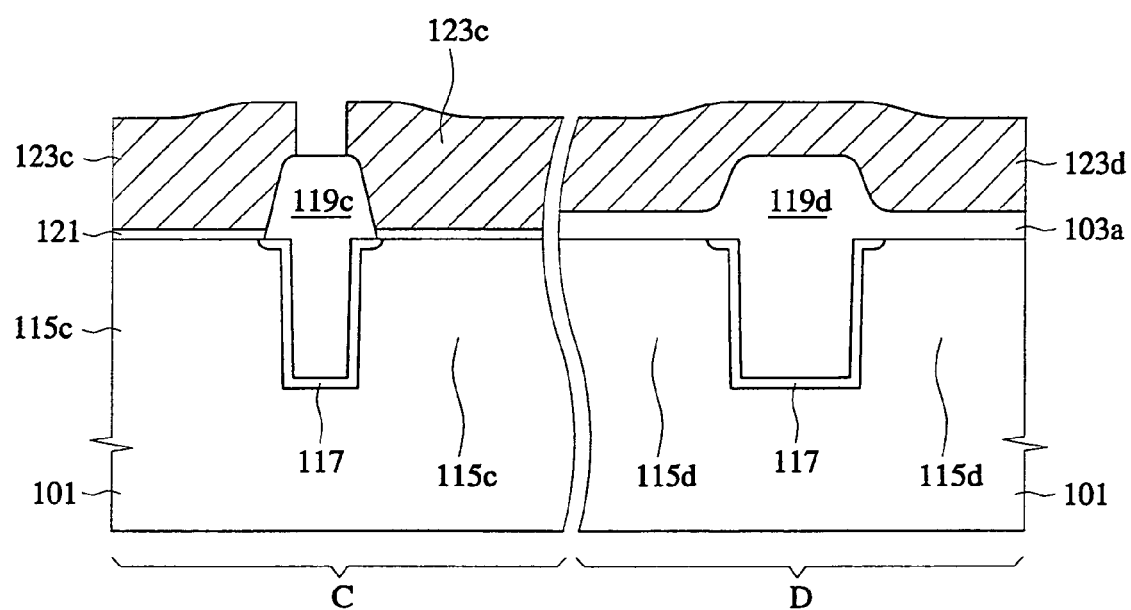

Referring to FIG. 18, the substrate where the pad insulation layer 105 is thermally oxidized to form a low voltage gate insulation layer 121 on the first active regions 115c. The low voltage gate insulation layer 121 is formed to be thinner than the final high voltage gate insulation layer 103a. A first conductive layer is formed on an entire surface of the substrate having the low voltage gate insulation layer 121. The first conductive layer is patterned to form low voltage gate electrodes 123c crossing over the first active regions 115c and high voltage gate electrodes 123d crossing over the second active regions 115d.

Alternatively, though not shown in the figures, floating gates and control gate electrodes may be formed in the low voltage region C and main gate electrodes and dummy gate electrodes may be formed in the high voltage region D. The floating gates, the control gate electrodes, the main gate electrodes and dummy gate electrodes can be formed using the same methods as the embodiment described with reference to FIGS. 9-13.

FIGS. 19 to 28 are cross sectional views for illustrating a method of fabricating a semiconductor device according to yet another embodiment of the invention.

Figure 19:
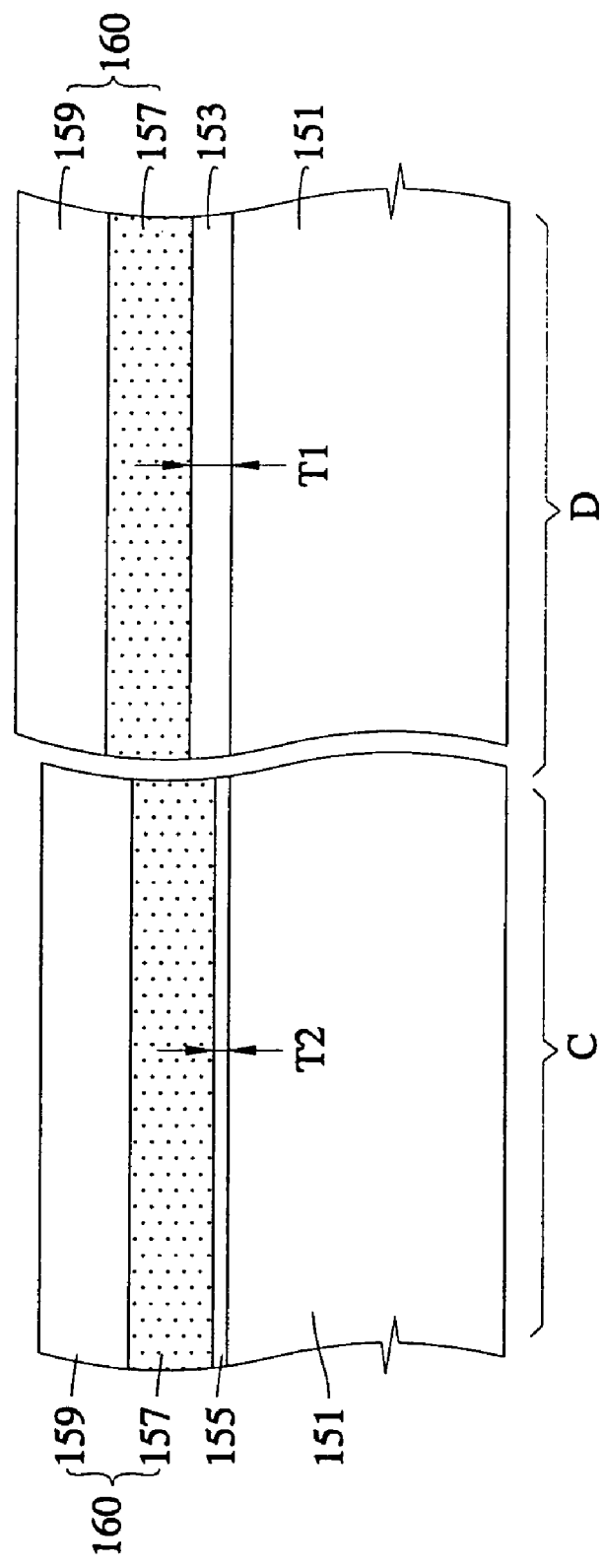
FIGS. 19 to 28 are cross sectional views for illustrating a manufacturing method of a semiconductor device according to still another embodiment of the present invention.

Referring to FIG. 19, an initial high voltage gate insulation layer 153, a pad insulation layer 155 and a hard mask layer 160 are formed on a semiconductor substrate 151 having a low voltage region C and a high voltage region D using the same manners as described above with reference to FIG. 9. Accordingly, the initial high voltage gate insulation layer 153 has a first thickness T1, and the pad insulation layer 155 has a second thickness T2 less than the first thickness T1. Also, the hard mask layer 160 may be formed by sequentially stacking a lower hard mask layer 157 and an upper hard mask layer 159. Alternatively, the hard mask layer 160 may be formed of only the lower hard mask layer 157.

Figure 20:
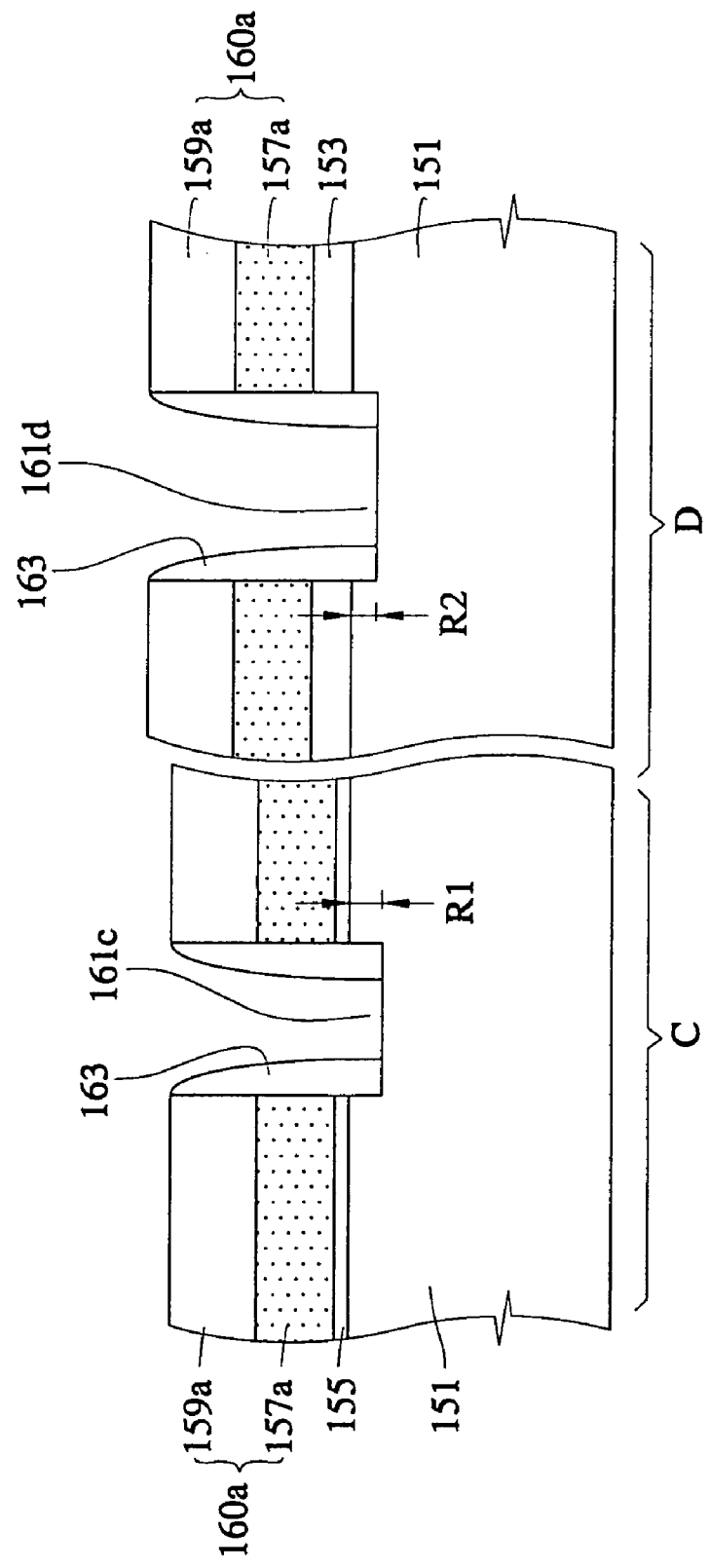

Referring to FIG. 20, the hard mask layer 160 is patterned to form a number of hard mask patterns 160a in the low voltage region C and the high voltage region D. Thus, each of the hard mask patterns 160a may be formed of a lower hard mask pattern 157a and an upper hard mask pattern 157b that are sequentially stacked or only the lower hard mask pattern 157a. Subsequently, the initial high voltage gate insulation layer 153, the pad insulation layer 155 and the semiconductor substrate 151 are etched using the hard mask patterns 160a as etching masks, thereby forming a first recessed region 161c and a second recessed region 161d in the low voltage region C and the high voltage region D respectively. A first depth R1 of the first recessed region 161c may be greater than a second depth R2 of the second recessed region 161d, since the pad insulation layer 155 is thinner than the initial high voltage gate insulation layer 153. The first and second depths R1 and R2 may be within the range of about 20 to 500 angstroms, for example. Spacers 163 are then formed on the sidewalls of the recessed regions 161c and 161d and the hard mask patterns 160a. The spacers 163 may be formed to have a width of about 100 to 300 angstroms. The spacers 163 can be formed of a thermal oxide layer, a CVD oxide layer or a CVD nitride layer.

Figure 21:
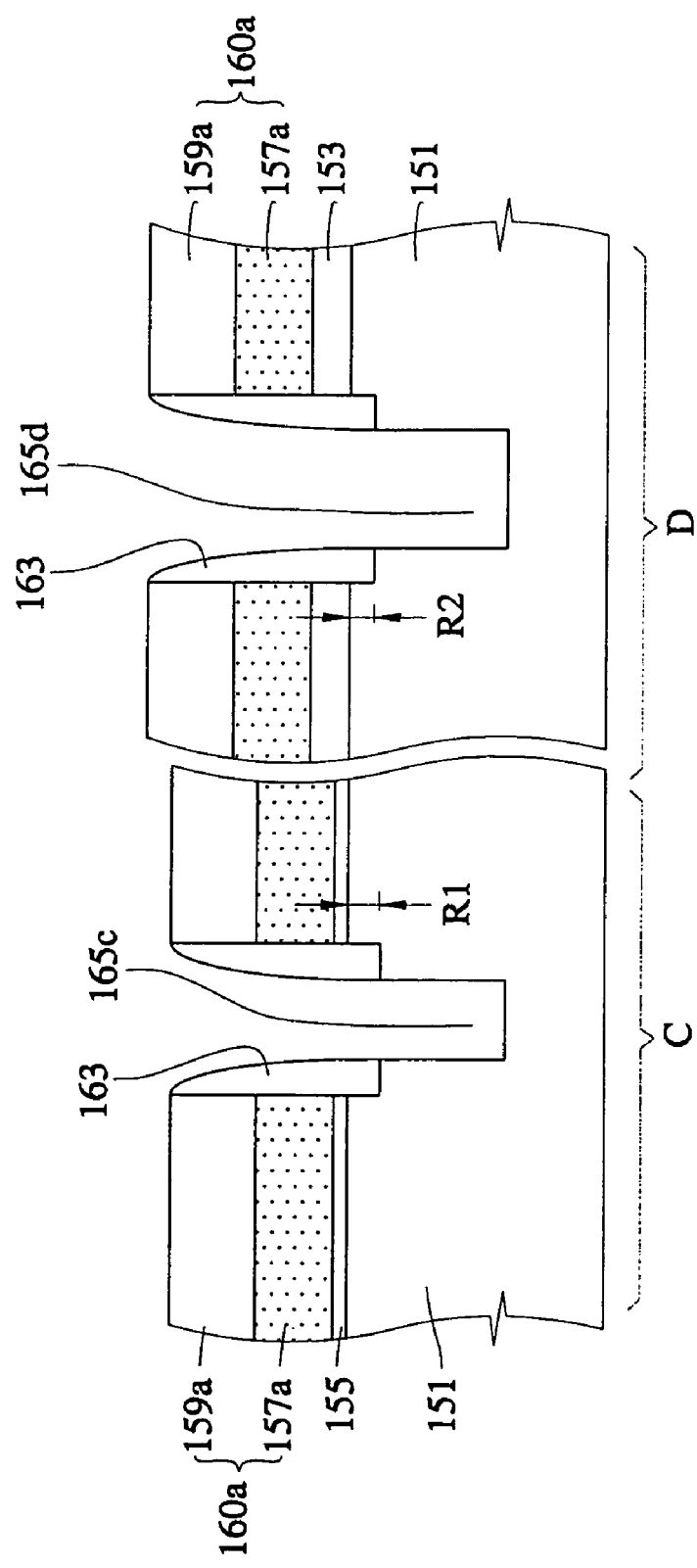

Referring to FIG. 21, the semiconductor substrate 151 is etched using the hard mask patterns 160a and the spacers 163 as etching masks, thereby forming a first trench region 165c and a second trench region 165d in the low voltage region C and the high voltage region D respectively. As a result, first and second active regions are defined in the low voltage region C and the high voltage region D respectively.

Figure 22:
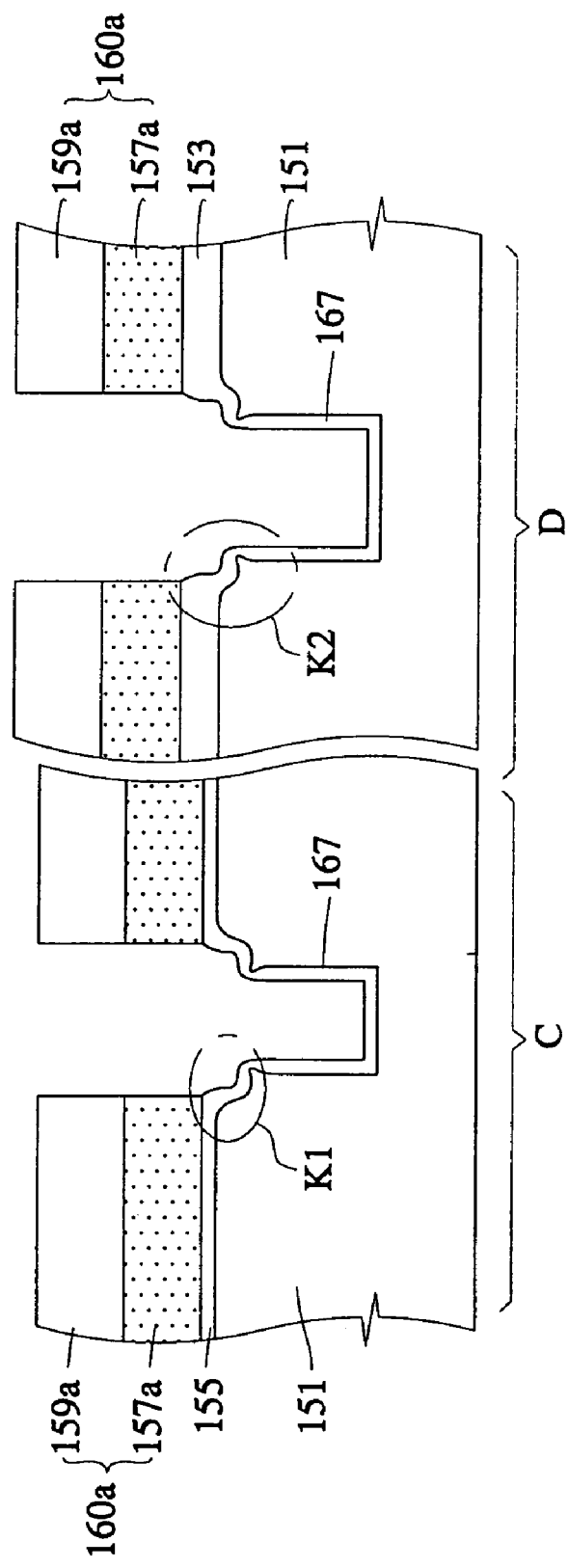

Referring to FIG. 22, the spacers 163 are removed using a wet etching process. When the spacers 163 are formed of a thermal oxide layer or a CVD oxide layer, the wet etching process may be performed using buffered oxide etchant (BOE). The substrate where the spacers 163 are removed may be thermally oxidized to form a thermal oxide layer 167 at inner walls of the recessed regions 161c and 161d as well as the trench regions 165c and 165d. Edge corner regions K1 of the first active regions and edge corner regions K2 of the second active regions have edge corners EC1 and edge corners EC2 that exhibit rounded shapes through the thermal oxidation process, as shown in enlarged sectional views of FIGS. 23 and 24 respectively.

Figure 23:
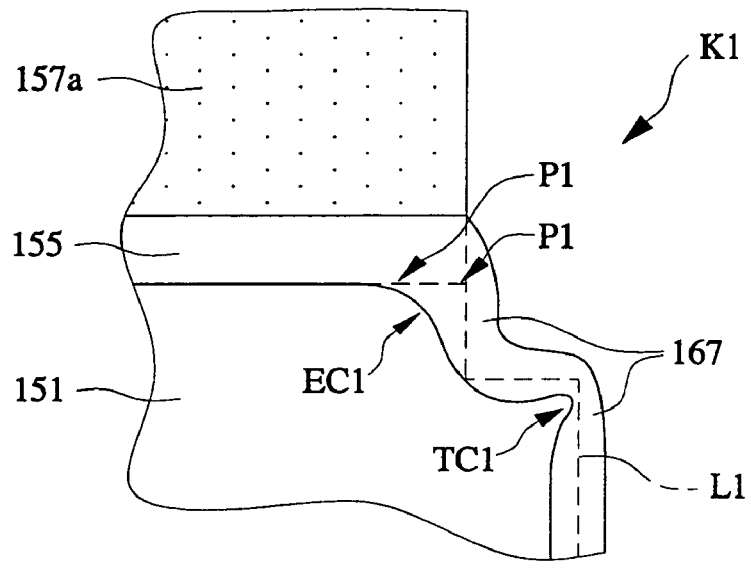
Figure 24:
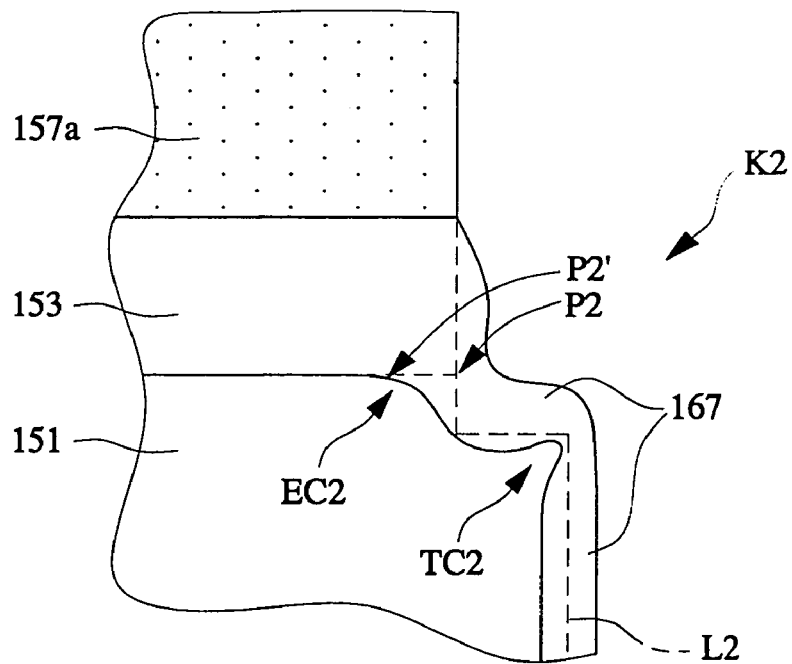

In FIGS. 23 and 24, dashed lines L1 and L2 represent pre-oxidation profiles. Referring to FIGS. 23 and 24, initial edge points P1 and P2 of the first and second active regions are moved toward the central region thereof because of a rounding effect which is due to the thermal oxidation process. As a result, the first and second active regions have new edge points P1' and P2' respectively. In the meantime, edge corners TC1 and TC2 of the first and second trench regions 165c and 165d may exhibit a relatively sharp configuration due to a thinning effect as shown in FIGS. 23 and 24.

Figure 25:
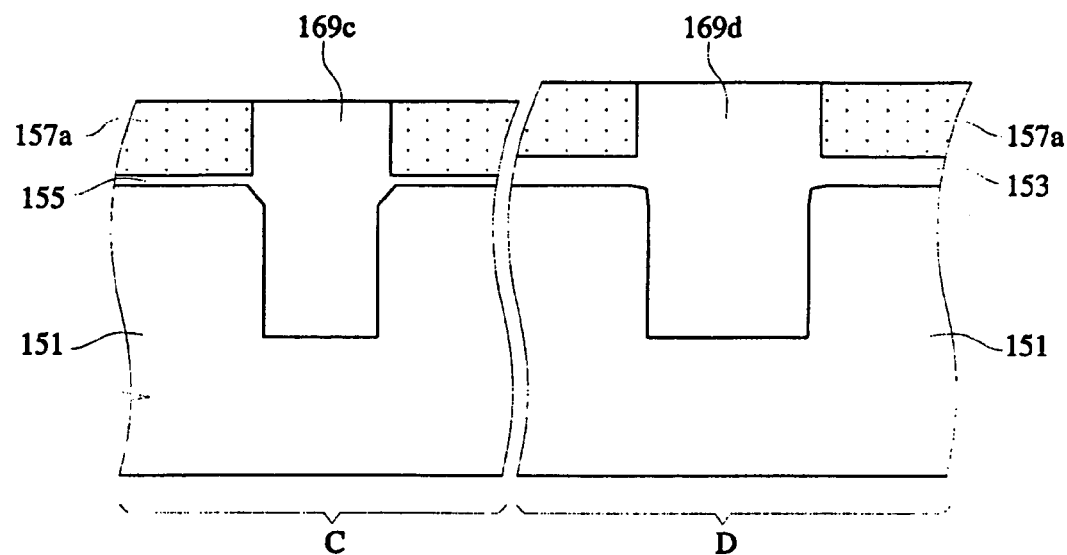

Referring to FIG. 25, first and second isolation layers 169c and 169d are respectively formed in the first and second trench regions 165c and 165d surrounded by the thermal oxide layer 167 using the same manners as described with reference to FIGS. 11 and 12. Accordingly, the lower hard mask patterns 157a are exposed.

Figure 26:
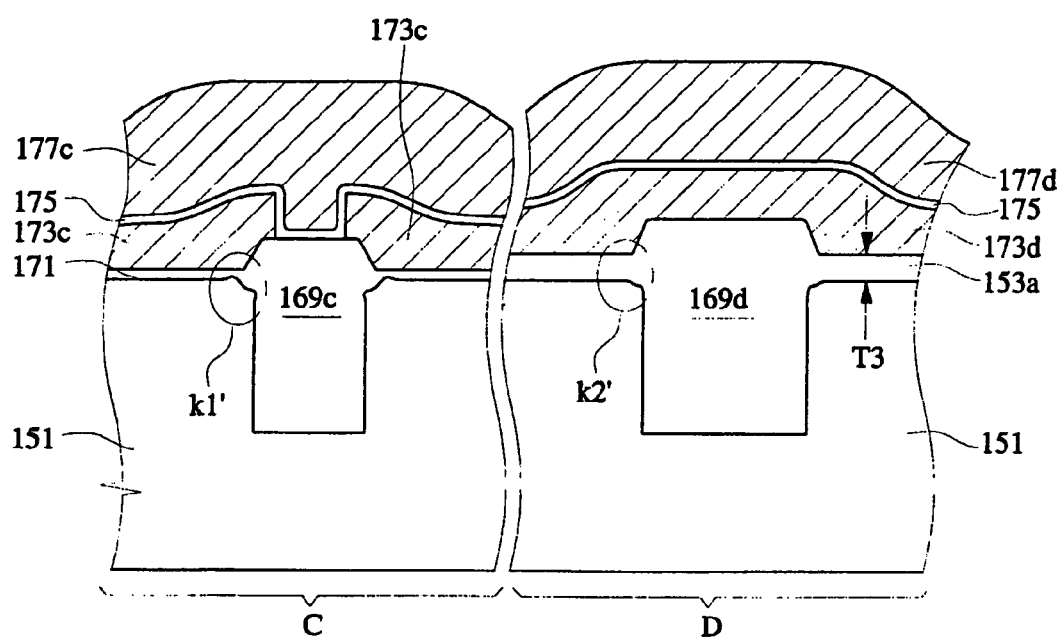

Referring to FIG. 26, the lower hard mask patterns 157a and the pad insulation layer 155 are removed using the same method as described above. As a result, the first active regions are exposed, and a final high voltage gate insulation layer 153a having a third thickness T3 less than the first thickness T1 remains on the second active regions. In this case, dents are not formed at edges of the first and second isolation layers 169c and 169d, as described in the text with reference to FIG. 17.

The substrate where the pad insulation layer 155 is removed is thermally oxidized to form a low voltage gate insulation layer 171 on the first active regions. The low voltage gate insulation layer 171 is formed to be thinner than the final high voltage gate insulation layer 153a. When the low voltage region C corresponds to a cell array region of a flash memory device and the high voltage region D corresponds to a high voltage MOS transistor region in a peripheral circuit region of the flash memory device, control gate electrodes 177c crossing over the first active regions, floating gates 173c interposed between the control gate electrodes 177c and the low voltage gate insulation layer 171, and an inter-gate dielectric layer 175 interposed between the control gate electrode 177c and the floating gates 173c are formed using the same methods as described with reference to the first-described embodiment. At the same time, a main gate electrode 173*d* and a dummy gate electrode 177*d* are formed in the high voltage region D. The main gate electrode 173*d* and the dummy gate electrode 177*d* are formed to be sequentially stacked and to cross over the second active region.

Meanwhile, when the low voltage region C corresponds to a low voltage MOS transistor region of a non-memory device and the high voltage region D corresponds to a high voltage MOS transistor region of the non-memory device, a low voltage gate electrode (173*c* of FIG. 26) crossing over the first active regions and a high voltage gate electrode (173*d* of FIG. 26) crossing over the second active regions are formed using the same methods as the first-described embodiment of the invention. In this case, the processes for forming the intergate dielectric layer 175, the control gate electrode 177*c* and the dummy gate electrode 177*d* are omitted.

Figure 27:
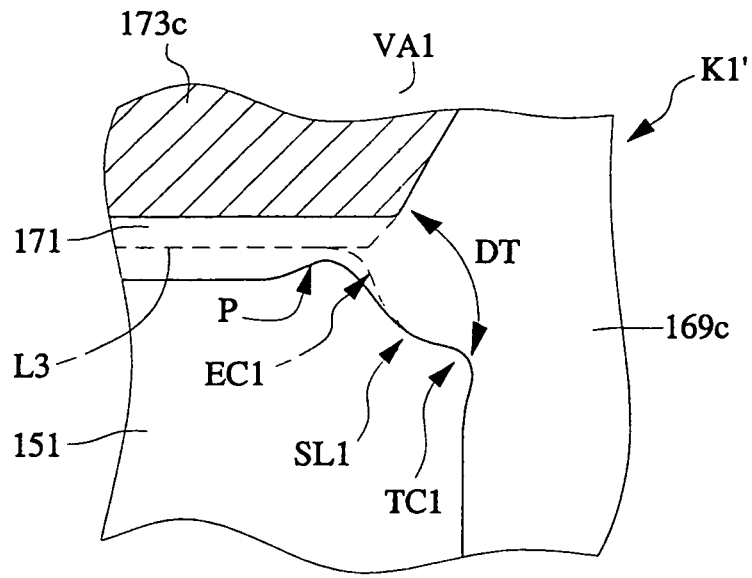
Figure 28:
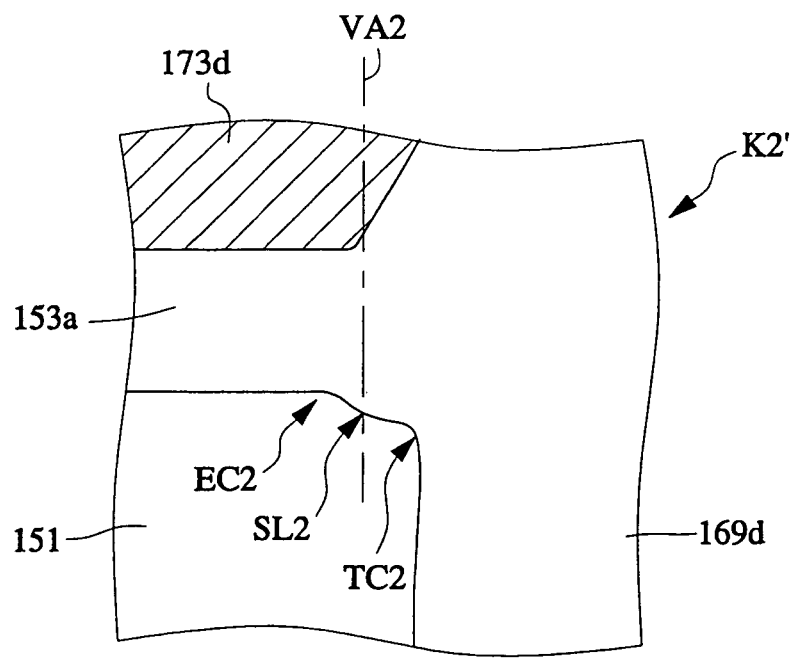

FIGS. 27 and 28 are enlarged sectional views illustrating the edge corner regions K1' and K2' of the first and second active regions of FIG. 26 respectively. In the drawings of FIGS. 27 and 28, a dashed line L3 indicates a surface profile of the substrate prior to formation of the low voltage gate insulation layer 171.

Referring to FIGS. 27 and 28, when the low voltage gate insulation layer 171 is formed on the exposed first active region using a thermal oxidation process, the low voltage gate insulation layer 171 thermally grown at a central region of the first active region is formed to be thicker than the low voltage gate insulation layer 171 thermally grown at edges of the first active region. As a result, protrusions P having a protruded surface profile are formed at the edges of the first active region. In other words, a "thinning effect" of the low voltage gate insulation layer 171 occurs at the edges of the first active region. Accordingly, when the low voltage gate insulation layer 171 corresponds to a tunnel oxide layer of a flash memory device, a program speed and/or an erasure speed of the flash memory device may be improved because of the presence of the protrusions P of the first active region. This is because when the tunnel oxide layer becomes thinner, the coupling ratio of the flash memory cells is decreased but tunneling current flowing through the tunnel oxide layer is exponentionally increased.

In addition, a first sloped region SL1 having a first inclined shape generated due to the first recessed region (161*c* of FIG. 20) is formed in the region between the first trench upper corner TC1 and the protrusion P. A first vertical axis VA1 passing through the top surface edge of the low voltage gate insulation layer 171 is located in the first sloped region SL1. Accordingly, a distance DT between the upper corner TC1 of the first trench region and the lower corner of the floating gate 173*c* (or the low voltage gate electrode) is greater than the thickness of the low voltage gate insulation layer 171. As a result, even though a subthreshold voltage is applied to the low voltage gate electrode 173*c*, it can prevent a parasitic channel from being formed at the edge sidewall of the first active region.

In the meantime, even though the low voltage gate insulation layer 171 is formed using the thermal oxidation process, the second active region still has a flat surface profile. This is because the second active region is covered with the final high voltage gate insulation layer 153*a* prior to formation of the low voltage gate insulation layer 171. A second sloped region SL2 having a second inclined shape generated due to the second recessed region (161*d* of FIG. 20) is formed in the region between the second trench upper corner TC2 and the second edge corner EC2. The second inclined shape may not be steeper than the first inclined plane. It can be understood that this is because the second recessed region 161*d* is shallower than the first recessed region 161*c*. A second vertical axis VA2 passing through the top surface edge of the high voltage gate insulation layer 153*a* is located in the second sloped region SL2.

To achieve the above-listed features of the invention, fabrication methods of a semiconductor device having multi-gate insulation layers and semiconductor devices fabricated thereby are provided. The methods may include a pad insulation layer and an initial high voltage gate insulation layer, which is thicker than the pad insulation layer, formed on a first region and a second region of a semiconductor substrate respectively, and a first isolation layer that passes through the pad insulation layer and a second isolation layer that passes through the high voltage gate insulation layer respectively formed in the semiconductor substrate of the first region and in the semiconductor substrate of the second region. Accordingly, it can minimize a depth of a recessed region (a dent region) to be formed at edges of the first isolation layer during removal of the pad insulation layer in order to form a low voltage gate insulation layer on an active region adjacent to the first isolation layer, and it can prevent a dent region from being formed at edges of the second isolation layer.

According to an aspect of the invention, the method includes preparing a semiconductor substrate that has a low voltage region and a high voltage region. An initial high voltage gate insulation layer and a pad insulation layer, which is thinner than the initial high voltage gate insulation layer, are formed on the semiconductor substrate in the high voltage region and on the semiconductor substrate in the low voltage region, respectively. Hard mask patterns are formed on the pad insulation layer and on the initial high voltage gate insulation layer. The pad insulation layer, the initial high voltage gate insulation layer and the semiconductor substrate are etched using the hard mask patterns as etching masks, thereby forming first trench regions and second trench regions respectively in the low voltage region and in the high voltage region. The first trench regions define first active regions in the low voltage region, and the second trench regions define second active regions in the high voltage region. First isolation layers and second isolation layers are respectively formed in the first and second trench regions. The hard mask patterns and the pad insulation layer are selectively removed to expose the first active regions and the initial high voltage gate insulation layer. A low voltage gate insulation layer, which is thinner than the initial high voltage gate insulation layer, is then formed on the exposed first active regions.

The low voltage region corresponds to a low voltage MOS transistor region, and the high voltage region corresponds to a high voltage MOS transistor region. Alternatively, the low voltage region may correspond to a memory cell array region, and the high voltage region may correspond to a high voltage MOS transistor region of a peripheral circuit region.

Preferably, forming the initial high voltage gate insulation layer and the pad insulation layer includes forming an initial high voltage gate oxide layer on an entire surface of the semiconductor substrate, selectively removing the initial high voltage gate oxide layer to expose the semiconductor substrate in the low voltage region, and thermally oxidizing the substrate where the initial high voltage gate oxide layer is selectively removed to form a pad oxide layer on the exposed semiconductor substrate. The initial high voltage gate oxide layer may be formed of a thermal oxide layer.

The hard mask patterns may be formed by depositing a hard mask layer on an entire surface of the substrate having the initial high voltage gate insulation layer and the pad insulation layer, and patterning the hard mask layer. The hard mask layer may be formed by sequentially stacking a lower hard mask layer and an upper hard mask layer. In this case, the lower hard mask layer is preferably formed of a first material layer having an etch selectivity with respect to the initial high voltage gate insulation layer, the pad insulation layer and the semiconductor substrate, and the upper hard mask layer is preferably formed of a second material layer having an etch selectivity with respect to the semiconductor substrate. The first material layer can be formed of a silicon nitride layer, and the second material layer can be formed of a silicon oxide layer.

Alternatively, the hard mask layer may be formed of a single material layer having an etch selectivity with respect to the initial high voltage gate insulation layer, the pad insulation layer and the semiconductor substrate. The single material layer is preferably formed of a silicon nitride layer.

The first and second isolation layers may be formed by depositing an insulation layer filling the trench regions on the substrate including the first and second trench regions, and planarizing the insulation layer until the hard mask patterns are exposed.

A thermal oxide layer may be additionally formed at inner walls of the first and second trench regions prior to formation of the first and second isolation layers.

The low voltage gate insulation layer may be formed of a thermal oxide layer.

Embodiments of the present invention may further include forming a low voltage gate electrode and a high voltage gate electrode on the low voltage gate insulation layer and the high voltage gate insulation layer, respectively. The low voltage gate electrode is formed to cross over the first active region, and the high voltage gate electrode is formed to cross over the second active region.

Alternatively, embodiments of the present invention may further include forming a floating gate pattern covering the low voltage gate insulation layer and a main gate pattern covering the high voltage region, sequentially forming an inter-gate dielectric layer and a conductive layer on the substrate having the floating gate pattern and the main gate pattern, and patterning the conductive layer, the inter-gate dielectric layer, the floating gate pattern and the main gate pattern to form a control gate electrode crossing over the first active region in the low voltage region as well as a floating gate interposed between the control gate electrode and the low voltage gate insulation layer and to simultaneously form a main gate electrode and a dummy gate electrode that are sequentially stacked and cross over the second active region in the high voltage region.

Moreover, some embodiments of the present invention may further include forming spacers on sidewalls of the hard mask patterns prior to formation of the first and second trench regions. In this case, the first and second trench regions are formed by etching the semiconductor substrate using the hard mask patterns and the spacers as etching masks, and the spacers are removed prior to formation of the first and second isolation layers.

According to another embodiment of the invention, a semiconductor device having multi-gate insulation layers is provided. The semiconductor device includes a semiconductor substrate having a low voltage region and a high voltage region. A first isolation layer is disposed at a predetermined region of the semiconductor substrate in the low voltage region, and a second isolation layer is disposed at a predetermined region of the semiconductor substrate in the high voltage region. The first and second isolation layers respectively define a first active region and a second active region. A low voltage gate insulation layer is stacked on the first active region, and a high voltage gate insulation layer, which is thicker than the low voltage gate insulation layer, is stacked on the second active region. A top surface of the second isolation layer is higher than that of the high voltage gate insulation layer. Thus, a step region exists in the border region between the high voltage gate insulation layer and the second isolation layer. The step region does not have any recessed region, which is lower than the top surface of the high voltage gate insulation layer. The step region is located at a position that is spaced apart from a vertical axis passing through an edge corner of the second active region toward the second isolation layer adjacent to the second active region.

Further, embodiments of the present invention further include a low voltage gate electrode formed on the low voltage gate insulation layer and a high voltage gate electrode formed on the high voltage gate insulation layer. The low voltage gate electrode crosses over the first active region, and the high voltage gate electrode crosses over the second active region.

Alternatively, some embodiments the present invention may further include a control gate electrode formed over the low voltage gate insulation layer, a floating gate interposed between the control gate electrode and the low voltage gate insulation layer, and a main gate electrode and a dummy gate electrode sequentially stacked on the high voltage gate insulation layer. The control gate electrode crosses over the first active region, and the main gate electrode crosses over the active region. Also, an inter-gate dielectric layer is interposed between the floating gate and the control gate electrode as well as between the main gate electrode and the dummy gate electrode.

In addition, a thermal oxide layer may be interposed between the first isolation layer and the semiconductor substrate. Also, the thermal oxide layer may be interposed between the second isolation layer and the semiconductor substrate.

In accordance with embodiments of the invention, the semiconductor device includes a semiconductor substrate having a low voltage region and a high voltage region. A first trench region defining a first active region is disposed at a predetermined region of the semiconductor substrate in the low voltage region. The first active region has a protrusion at an edge thereof. The protrusion has a protruded surface profile. A first sloped region is interposed between the first active region and the first trench region. The first sloped region has a first inclined shape that is downwardly extended from the protrusion of the first active region. A second trench region defining a second active region is disposed at a predetermined region of the semiconductor substrate in the high voltage region. The second active region has a flat surface. A second sloped region is interposed between the second active region and the second trench region. The second sloped region has a second inclined shape that is downwardly extended from an edge corner of the second active region. The first trench region is filled with a first isolation layer, and the first isolation layer covers the first inclined plane. Similarly, the second trench region is filled with a second isolation layer, and the second isolation layer covers the second inclined plane. The first active region is covered with a low voltage gate insulation layer. The low voltage gate insulation layer has a top surface lower than the top surface of the first isolation layer. The second active region is covered with a high voltage gate insulation layer. The high voltage gate insulation layer has a flat top surface lower than the top surface of the second isolation layer. The high voltage gate insulation layer is thicker than the low voltage gate insulation layer. The top surfaces of the low voltage gate insulation layer and the high voltage gate insulation layer have profiles without any recessed dent.

According to the foregoing embodiments, it can prevent dent regions from being formed at edge regions of the isolation layers in the high voltage region. Thus, it is able to realize a reliable high voltage MOS transistor. In addition, even though the dent regions are formed at edge regions of the isolation layers in the low voltage region, the depth of the dent regions can be reduced as compared to the conventional art. Accordingly, it is possible to minimize the probability that stringers remain on the edge regions the isolation layers between the adjacent low voltage gate electrodes or between the adjacent floating gates.

What is claimed is:

1. A semiconductor device comprising:
    a semiconductor substrate having a low voltage region and a high voltage region;
    a first trench region formed in the low voltage region to define a first active region having a top surface, the first active region having a protruded edge portion that extends above the top surface;
    a first sloped region interposed between the first trench region and the first active region, the first sloped region having a first incline that is downwardly extended from the protruded edge portion of the first active region;
    a second trench region formed in the high voltage region to define a second active region, the second active region having a relatively flat top surface;
    a second sloped region interposed between the second active region and the second trench region, the second sloped region having a second incline that is downwardly extended from the edge corner of the second active region;
    a first isolation layer filling the first trench region and covering the first incline;
    a second isolation layer filling the second trench region and covering the second incline;
    a low voltage gate insulation layer formed on the first active region, the low voltage gate insulation layer having a top surface lower than a top surface of the first isolation layer; and
    a high voltage gate insulation layer formed on the second active region, the high voltage gate insulation layer having a flat top surface lower than a top surface of the second isolation layer and being thicker than the low voltage gate insulation layer.

2. The semiconductor device of claim 1, wherein the low voltage gate insulation layer on the protruded edge surface of the first active region is thinner than the low voltage gate insulation layer on a central region of the first active region.

3. The semiconductor device of claim 1, wherein a vertical axis passing through the edge of the top surface of the low voltage gate insulation layer is located in the first sloped region.

4. The semiconductor device of claim 1, further comprising:
    a low voltage gate electrode formed on the low voltage gate insulation layer and disposed to cross over the first active region; and
    a high voltage gate electrode formed on the high voltage gate insulation layer and disposed to cross over the second active region.

5. The semiconductor device of claim 4, wherein a distance between an upper corner of the first trench region and a lower corner of the low voltage gate electrode is greater than the thickness of the low voltage gate insulation layer.

6. The semiconductor device of claim 1, wherein the low voltage region is a memory cell region.

7. The semiconductor device of claim 6, wherein the low voltage gate insulation layer is a tunnel oxide layer.

8. The semiconductor device of claim 7, further comprising:
    a control gate electrode formed over the tunnel oxide layer and disposed to cross over the first active region;
    a floating gate interposed between the control gate electrode and the tunnel oxide layer;
    an inter-gate dielectric layer interposed between the floating gate and the control gate electrode;
    a main gate electrode formed on the high voltage gate insulation layer and disposed to cross over the second active region; and
    a dummy gate electrode stacked on the main gate electrode.

* * * * *